United States Patent
Park et al.

(10) Patent No.: US 8,426,959 B2
(45) Date of Patent: Apr. 23, 2013

(54) SEMICONDUCTOR PACKAGE AND METHOD OF MANUFACTURING THE SAME

(75) Inventors: Ji-hyun Park, Suwon-si (KR); Heungkyu Kwon, Seongnam-si (KR); Min-Ok Na, Bucheon-si (KR); Taehwan Kim, Yongin-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 118 days.

(21) Appl. No.: 12/857,928

(22) Filed: Aug. 17, 2010

(65) Prior Publication Data

US 2011/0042797 A1 Feb. 24, 2011

(30) Foreign Application Priority Data

Aug. 19, 2009 (KR) .................. 10-2009-0076861
Apr. 30, 2010 (KR) ...................... 10-2010-40903

(51) Int. Cl.
*H01L 23/28* (2006.01)

(52) U.S. Cl.
USPC ............................................. 257/690

(58) Field of Classification Search .......... 257/690, 257/774–769
See application file for complete search history.

(56) References Cited

U.S. PATENT DOCUMENTS

| | | | | |
|---|---|---|---|---|
| 5,447,996 A * | 9/1995 | Asai et al. | ...................... | 525/398 |
| 5,827,604 A * | 10/1998 | Uno et al. | ....................... | 428/209 |
| 6,204,454 B1 * | 3/2001 | Gotoh et al. | .................... | 174/255 |
| 6,217,987 B1 * | 4/2001 | Ono et al. | ....................... | 428/209 |
| 6,316,288 B1 * | 11/2001 | Hashimoto | .................... | 438/118 |
| 6,411,519 B2 * | 6/2002 | Asai et al. | ...................... | 361/794 |
| 6,762,921 B1 * | 7/2004 | Asai et al. | ...................... | 361/111 |
| 7,064,015 B2 * | 6/2006 | Azuma | .......................... | 438/125 |
| 7,084,498 B2 * | 8/2006 | Yamaguchi et al. | ........... | 257/737 |
| 7,135,354 B2 * | 11/2006 | Ito | ................................... | 438/113 |
| 7,504,719 B2 * | 3/2009 | En et al. | ......................... | 257/700 |
| 7,622,183 B2 * | 11/2009 | Shirai et al. | .................... | 428/209 |
| 7,691,189 B2 * | 4/2010 | En et al. | ......................... | 106/1.23 |
| 2008/0029858 A1 | 2/2008 | Merilo et al. | | |
| 2008/0174009 A1 * | 7/2008 | Shih | ................................ | 257/734 |
| 2008/0174025 A1 | 7/2008 | Ryu et al. | | |
| 2008/0185695 A1 | 8/2008 | Kim et al. | | |

FOREIGN PATENT DOCUMENTS

JP 2008-187054 8/2008
KR 2007-121562 12/2007

* cited by examiner

*Primary Examiner* — Nathan Ha
(74) *Attorney, Agent, or Firm* — Stanzione & Kim, LLP

(57) ABSTRACT

A semiconductor package includes a substrate having an insulation layer. The insulation layer has a first region having a first surface roughness and a second region having a second surface roughness. A semiconductor chip is mounted in the first region, and an underfill resin solution is filled into the space between the semiconductor chip and the insulation layer. The roughness of the second region prevents the underfill resin from flowing out from the semiconductor chip to thereby reduce a size of the semiconductor package.

29 Claims, 44 Drawing Sheets

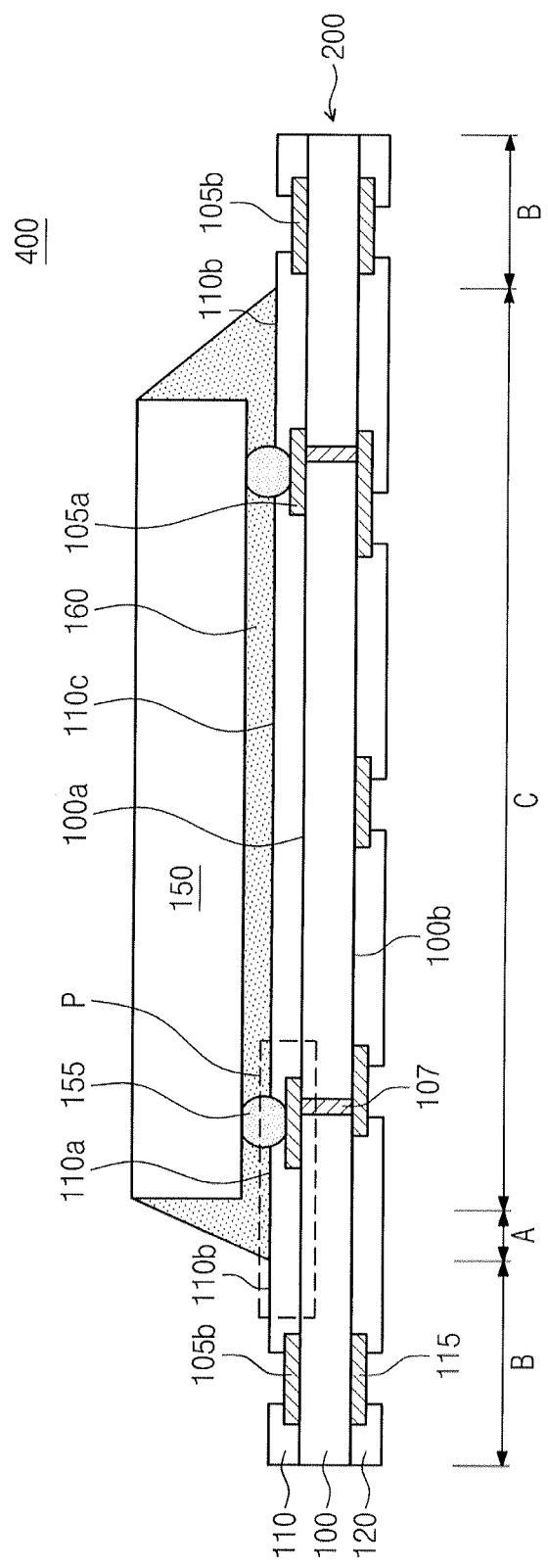

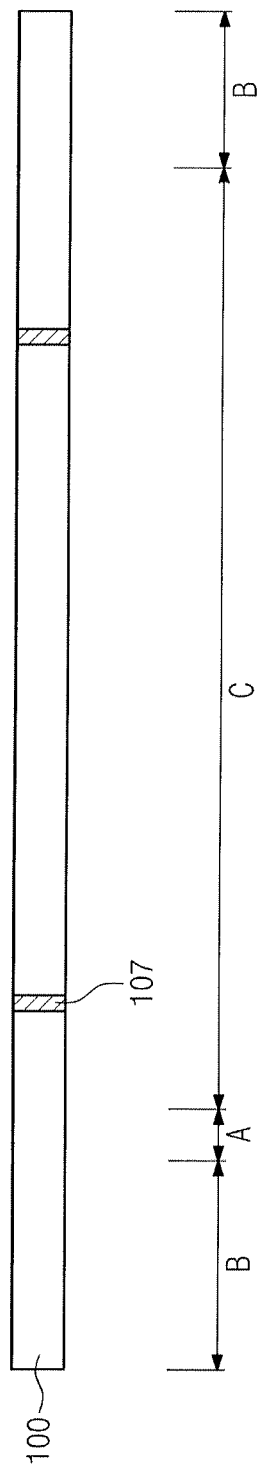

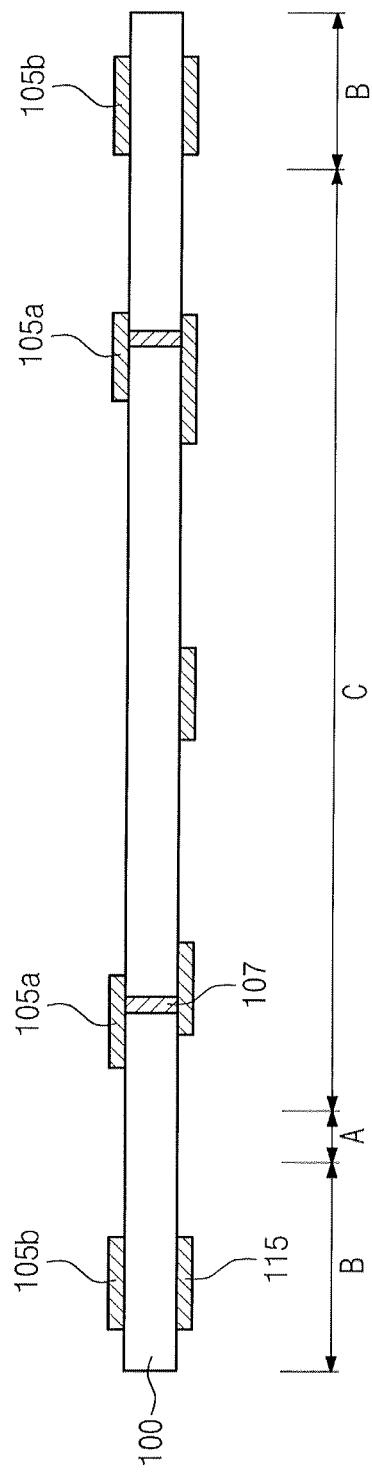

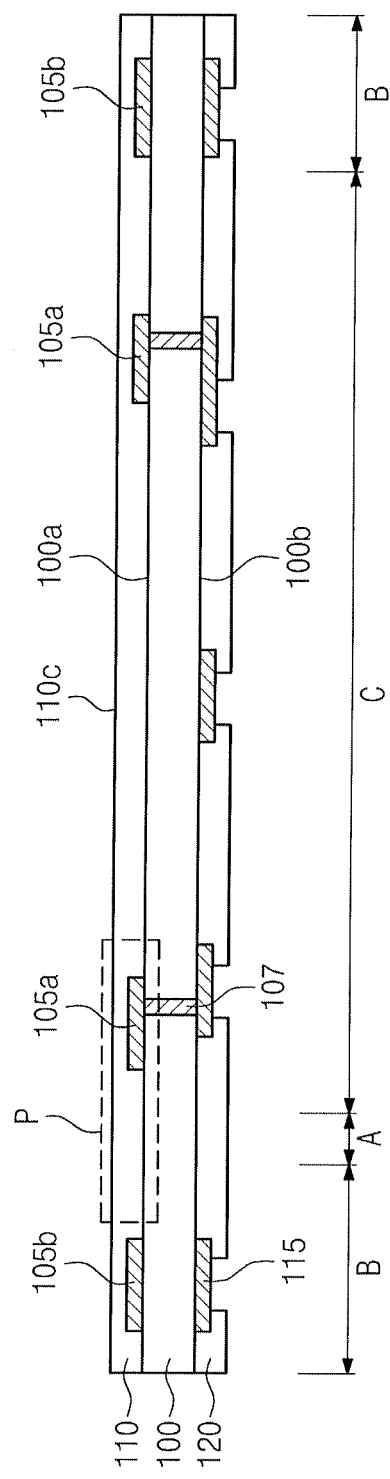

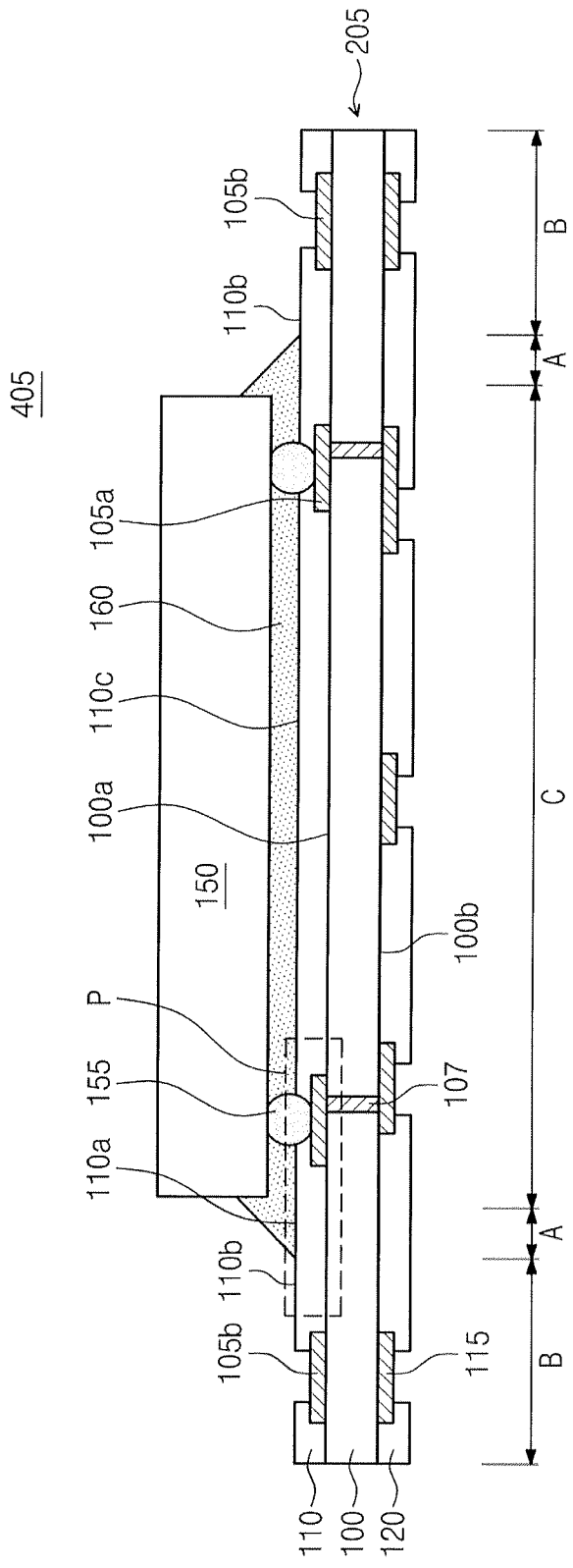

SEMICONDUCTOR PACKAGE AND METHOD OF MANUFACTURING THE SAME

CROSS-REFERENCE TO RELATED APPLICATIONS

This U.S. non-provisional patent application claims the benefit of priority under 35 U.S.C. §119 of Korean Patent Application No. 10-2009-0076861, filed on Aug. 19, 2009, and Korean Patent Application No. 10-2010-0040903, filed on Apr. 30, 2010, the entire contents of which are hereby incorporated by reference.

BACKGROUND

The present disclosure relates to a semiconductor package and method of manufacturing the same.

The development of the electronic industry increasingly requires high functionality, high response rate, and miniaturization of electronic components. In response to this trend, semiconductor mounting techniques such as stacking several semiconductor chips on a single substrate or stacking one package on another package have developed. However, such semiconductor mounting techniques may increase a total thickness of a final package or cause a limitation in adhesion stability. Also, it is important to prevent moisture and foreign particles from penetrating into the above semiconductor packages, and various techniques have been developed to achieve this result.

SUMMARY

The present disclosure provides a semiconductor package having a decreased size and increased stability.

The present disclosure also provides a method of manufacturing a semiconductor package that can decrease the size thereof and at the same time enhance the stability thereof.

Features and/or utilities of the present general inventive concept may be realized by a semiconductor package including a first substrate, the first substrate including a first surface portion positioned at a first region and a second surface portion positioned at a second region adjacent to the first region and connected with the first surface portion. The first surface portion may have a surface roughness which is different from a surface roughness of the second surface portion.

The semiconductor package may further include a first semiconductor chip mounted on the first substrate, and a first passivation layer filling a space between the first semiconductor chip and the first substrate. The first region may be adjacent to an end of the first semiconductor chip.

The surface roughness of the first surface portion may be less than the surface roughness of the second surface portion.

The first substrate may further include a third region overlapping the first semiconductor chip, and a third surface portion disposed at the third region and connected with the first surface portion. The third surface portion may have a surface roughness which is different from those of the first and second surface portions. The surface roughness of the third surface portion may be smaller than the surface roughness of the first surface portion.

The second region may have at least one closed curve shape enclosing the first semiconductor chip or a bar shape adjacent to one end of the first substrate. The first region may have a U-shape or a closed curve shape.

The first substrate may further include a substrate body including a first surface and a second surface, a first connection terminal disposed on the first surface of the substrate body, and a first insulating layer covering the first surface of the substrate body but exposing the first connection terminal. The first insulating layer may include the first surface portion at the first region and the second surface portion at the second region.

The first connection terminal may be disposed at the third region, and the semiconductor chip may be mounted on the first connection terminal.

The first substrate may include a second connection terminal disposed on the first surface of the substrate body and spaced apart from the first connection terminal, and the second connection terminal may be disposed at the second region and be exposed by the first insulating layer.

The semiconductor package may further include a second substrate disposed above the first substrate and electrically connected with the first substrate through the second connection terminal and a second semiconductor chip mounted on the second substrate.

The first substrate may include a third connection terminal disposed on the second surface of the substrate body and a second insulating layer covering the second surface of the substrate body but exposing the third connection terminal. The second insulating layer may have a fourth surface portion and a fifth surface portion at the first region and the second region, respectively, and the fourth surface portion may have a surface roughness which is different from a surface roughness of the fifth surface portion.

The semiconductor package may further include a second semiconductor chip mounted on the third connection terminal below the first substrate and a second passivation layer filling a space between the second semiconductor chip and the first substrate. The surface roughness of the fourth surface portion may be smaller than the surface roughness of the fifth surface portion.

The surface roughness of the third surface portion may be about 0 μm. A center line average Ra (or roughness average) of the surface roughness of the first surface portion may be preferably about 0.01-0.5 μm, more preferably about 0.086 μm. A ten point height Rz of the surface roughness of the first surface portion may be preferably about 0.5-3 μm, more preferably about 1.492 μm. A ten point height Rz of the surface roughness of the second surface portion may be preferably about 10-100 μm, more preferably about 18 μm.

Features and/or utilities of the present general inventive concept may also be realized by a method of manufacturing a semiconductor package, the method including forming a substrate including a first region and a second region, the first region having a first surface portion and the second region having a second surface portion connected with the first surface portion, mounting a semiconductor chip on the substrate, and forming a passivation layer filling a space between the semiconductor chip and the substrate. The substrate may be formed such that the second surface portion has a surface roughness which is different from a surface roughness of the first surface portion.

Forming the substrate may include preparing a substrate body, forming a photosensitive insulating layer on a front surface of the substrate body, performing an exposure process with respect to the photosensitive insulating layer by using a gray photomask including a first portion and a second portion respectively corresponding to the first region and second region and having different light transmittances, and forming the first and second surface portions having different surface roughnesses on the photosensitive insulating layer by removing an exposed portion.

Forming the substrate may include preparing a substrate body, forming an insulating layer on a front surface of the substrate body, and performing a first blast process with respect to the insulating layer on the first region. The forming of the substrate may further include performing a second blast process with respect to the insulating layer on the second region.

Features and/or utilities of the present general inventive concept may also be realized by a semiconductor package including a substrate having connection terminals to connect to a semiconductor chip, and an insulation layer formed on the substrate to have a first region and a second region. The first region may include a chip mounting area corresponding to the connection terminals, and the second region may have a surface roughness that is different from a surface roughness of the first region.

The second region may entirely surround the first region.

The second region may surround only sides of the first region corresponding to three coordinate directions.

The first region may have a substantially flat surface.

The second region may have a surface roughness greater than that of the first region.

The second region may have a center line average surface roughness between 0.01-0.5 μm.

The semiconductor package may further include a third region surrounding the second region and having a surface roughness different from the surface roughness of the first region and the second region.

The surface roughness of the third region may be greater than the surface roughness of the first and second regions.

The surface roughness of the second region may be greater than the surface roughness of the first region.

Each of the second and third regions may have a surface shape substantially corresponding to a square-wave shape, each of the second and third regions having a plurality of troughs and peaks of different heights, depths, and widths to define the surface roughness of the second and third regions, respectively.

The semiconductor package may further include the semiconductor chip mounted to the connection terminals of the substrate, and underfill resin located between the semiconductor chip and the first region of the insulating layer. The surface roughness of the second region may prevent the underfill resin from flowing past the second region.

The second region may include a first sub-region and a second sub-region separated by a surface that may have substantially the same surface roughness as the surface roughness of the first region.

Features and/or utilities of the present general inventive concept may also be realized by a method of forming a semiconductor package including forming a substrate having at least a first region including a plurality of connection terminals and a second region to surround at least a portion of the first region, forming an insulating layer on the substrate to have a first region corresponding to the first region of the substrate and a second region corresponding to the second region of the substrate, and treating a surface of the insulating layer so that the second region of the insulating layer may have a surface roughness different from the first region of the insulating layer.

Treating the surface of the insulating layer may include performing lithographic etching to form a predetermined roughness on the surface of the second region.

Treating the surface of the insulating layer may include performing a blasting operation to form a predetermined roughness on the surface of the second region.

The insulating layer further may include a third region surrounding at least a part of the second region, wherein a surface roughness of the third region is different than the surface roughness of the first region and the second region.

The surface roughness of the third region of the insulating layer may be greater than the surface roughness of the second region of the insulating layer, and the surface roughness of the second region of the insulating layer may be greater than the surface roughness of the first region of the insulating layer.

Treating the surface of the insulating layer may include performing lithographic etching to form a predetermined first roughness on the surface of the third region, and performing lithographic etching to form a predetermined second roughness on the surface of the second region.

Performing lithographic etching to form a predetermined second roughness on the surface of the second region may include forming the second roughness on the etched surface of the third region.

Treating the surface of the insulating layer may include performing a blasting operation to form a predetermined first roughness on the surface of the third region, and performing a blasting operation to form a predetermined second roughness on the surface of the second region.

Performing the blasting operation to form a predetermined second roughness on the surface of the second region may include forming the second roughness on the blasted surface of the third region.

The method may further include mounting a semiconductor chip onto the plurality of connection terminals and filling a space between the first surface of the insulation layer and the semiconductor chip with an underfill resin solution. The roughness of the second region of the insulating layer may prevent the underfill resin from flowing past an outer end of the second region of the insulating layer.

Features and/or utilities of the present general inventive concept may also be realized by an electronic device including memory to store at least one of data and commands, a controller to control the memory to transmit data to and retrieve data from the memory, and an interface to control the controller to access the memory. At least one of the memory and the controller may include a semiconductor package including a substrate having connection terminals to connect to a semiconductor chip and an insulation layer formed on the substrate to have a first region and a second region. The first region may include a chip mounting area corresponding to the connection terminals, and the second region may have a surface roughness that is different from a surface roughness of the first region.

BRIEF DESCRIPTION OF THE DRAWINGS

The accompanying drawings are included to provide a further understanding of the present general inventive concept, and are incorporated in and constitute a part of this specification. The drawings illustrate exemplary embodiments of the inventive concept and, together with the description, serve to explain principles of the inventive concept. In the drawings:

FIG. 2A is a cross-sectional view taken along line I-I' of FIG. 1;

FIGS. 3A-3E, 4A, 5A, and 6A are cross-sectional views illustrating a method of forming a semiconductor package having the section of FIG. 2A according to an example of the present general inventive concept;

FIG. 15A is a cross-sectional view taken along line I-I' of FIG. 14;

DETAILED DESCRIPTION OF THE EMBODIMENTS

Figure 1:
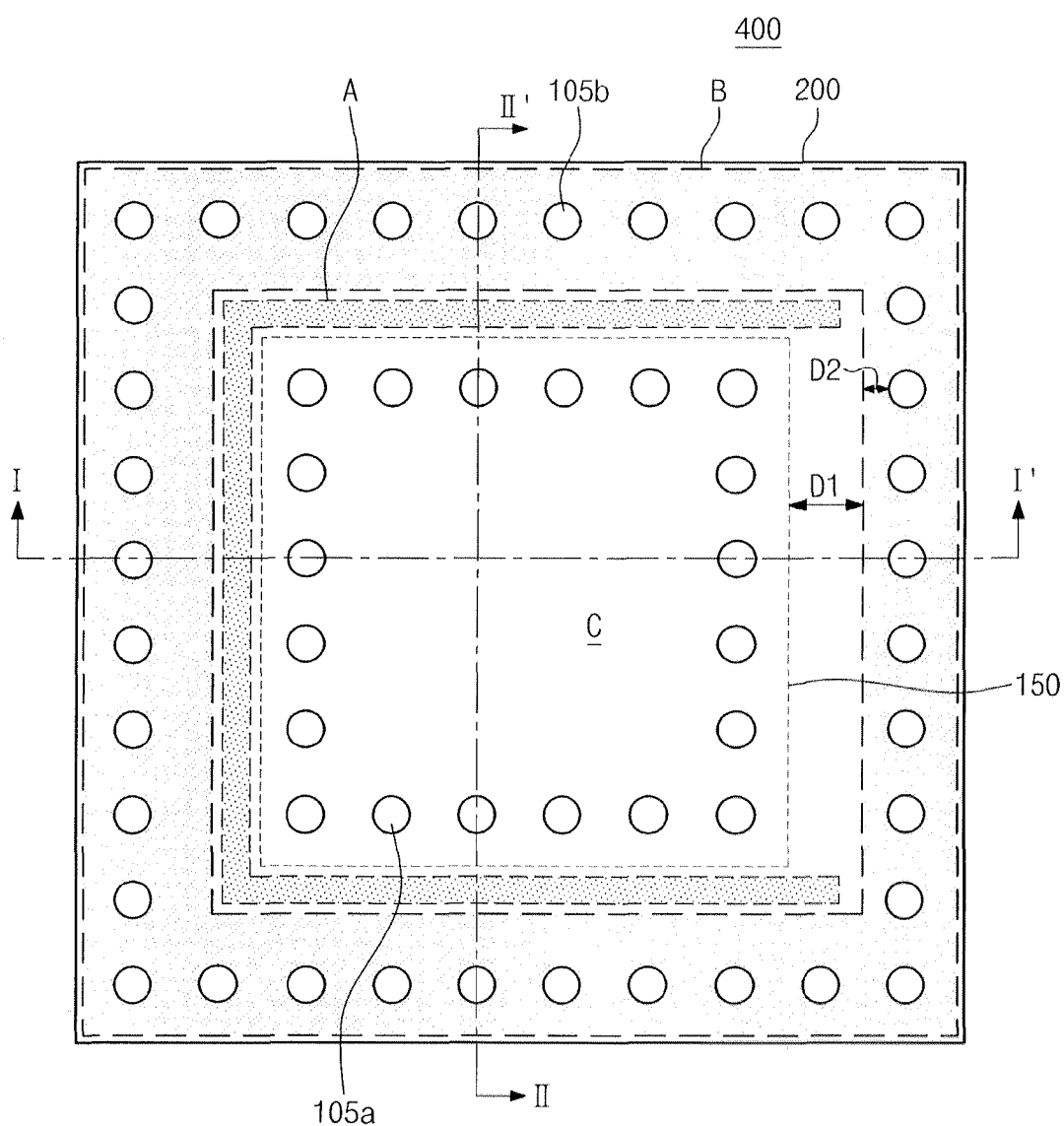
FIG. 1 is a layout diagram of a semiconductor package according to an embodiment of the present general inventive concept.

Exemplary embodiments of the present general inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the present general inventive concept to those skilled in the art. In the figures, the dimensions of elements may be exaggerated for convenience of illustration. In the specification, the dimensions of layers and regions are exaggerated for clarity of illustration. It will also be understood that when a layer (or film) is referred to as being 'on' another layer or substrate, it can be located directly on the other layer or substrate, or intervening layers may also be present. Throughout this specification, like reference numerals refer to like elements throughout.

Figure 2B:
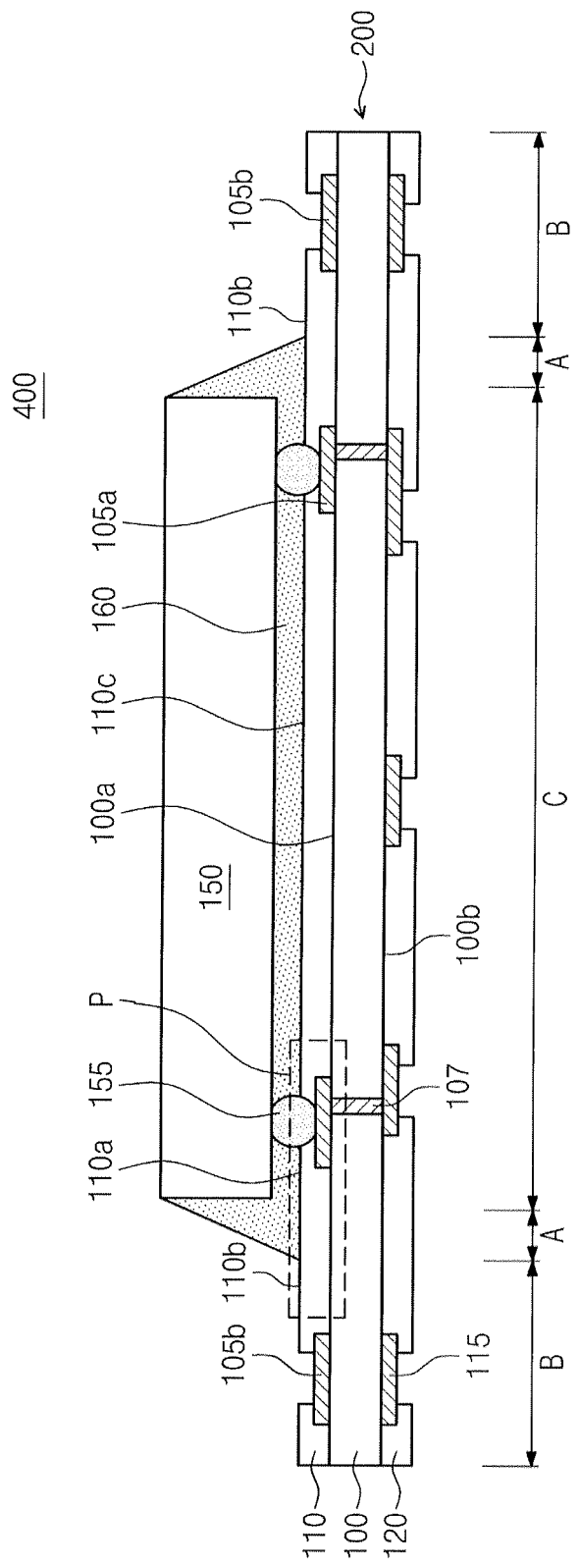
FIG. 2B is a cross-sectional view taken along line II-II' of FIG. 1.
Figure 2C:
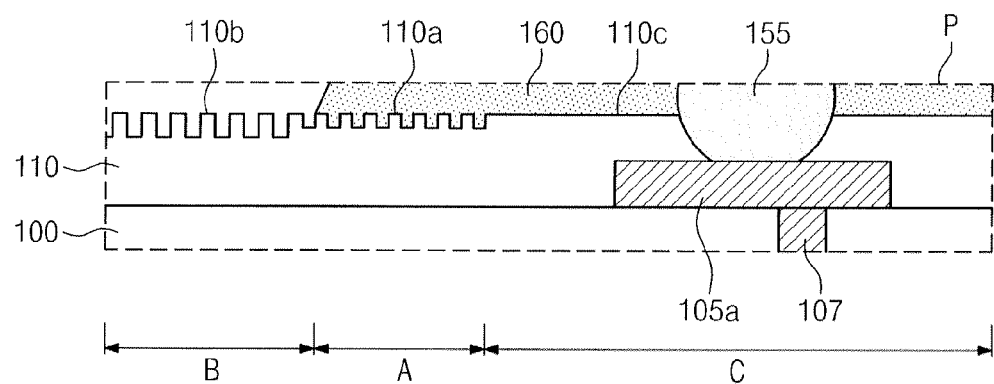
FIG. 2C is a detailed view of portion 'P' of FIG. 2A or FIG. 2B according to an example of the present general inventive concept.

FIG. 1 is a layout diagram of a semiconductor package according to an embodiment of the present general inventive concept. FIG. 2A is a cross-sectional view taken along line I-I' of FIG. 1. FIG. 2B is a cross-sectional view taken along line II-II' of FIG. 1. FIG. 2C is a detailed view of portion 'P' of FIG. 2A or FIG. 2B according to an example of the present general inventive concept.

Referring to FIGS. 1, 2A and 2B, a semiconductor package 400 includes a substrate 200. The substrate 200 may include a first region A, a second region B and a third region C. The third region C may include a chip mounting region. The respective regions A, B and C of the substrate 200 have different surface roughness. The substrate 200 includes a substrate body 100 including a first surface 100a and a second surface 100b. The substrate body 100 may be formed of an insulating material, for example, bismaleimide triazine resin, alumina-based ceramic or glass-based ceramic. The substrate body 100 may include a single-layered insulating layer or multi-layered insulating layers and a conductive pattern disposed between the multi-layered insulating layers. A first connection terminal 105a and a second connection terminal 105b are disposed on the first surface 100a. The first connection terminal 105a may be disposed on the third region C. The second connection terminal 105b may be disposed on the second region B and be spaced apart from the first connection terminal 105a. Third connection terminals 115 may be disposed on the second surface 100b. In this embodiment, the layout of the third connection terminals may be arbitrarily designed regardless of the regions A, B and C.

The connection terminals 105a, 105b, 115 may include a conductive material, for example, copper. A first insulating layer 110 is disposed on the first surface 100a to expose the first and second connection terminals 105a, 105b. The first and second connection terminals 105a, 105b may be electrically connected with the third connection terminals 115 through a via 107 penetrating the substrate body 100. The semiconductor chip 150 may have an external connection terminal 155 connected with the first connection terminal 105a in a flip chip bonding. The external connection terminal 155 may be one selected from a group consisting of a conductive bump, a solder ball, a conductive spacer, a pin grid array (PGA), a lead grid array (LGA) and a combination thereof. A space between the semiconductor chip 150 and the substrate 200 may be filled with a passivation layer 160. The passivation layer 160 may be formed by hardening an epoxy resin solution for underfill. The passivation layer 160 may further include silica. The passivation layer 160 is disposed below the semiconductor chip 150 so as to overlap the third region C. The passivation layer 160 may partially overlap the first region A. The passivation layer 160 may cover a sidewall of the semiconductor chip 150. In this embodiment, the first region A may be formed between the second region B and the third region C to have a U-shape along edges of the semiconductor chip 150 as viewed in the plan view of FIG. 1. In FIG. 1, the second region B may be spaced apart from a mounted chip 150 by a first distance D1. An inner lateral edge of the second region B may be spaced apart from the second connection terminal by a second distance D2. The second distance D2 may be preferably longer than 150 µm.

Figure 2D:
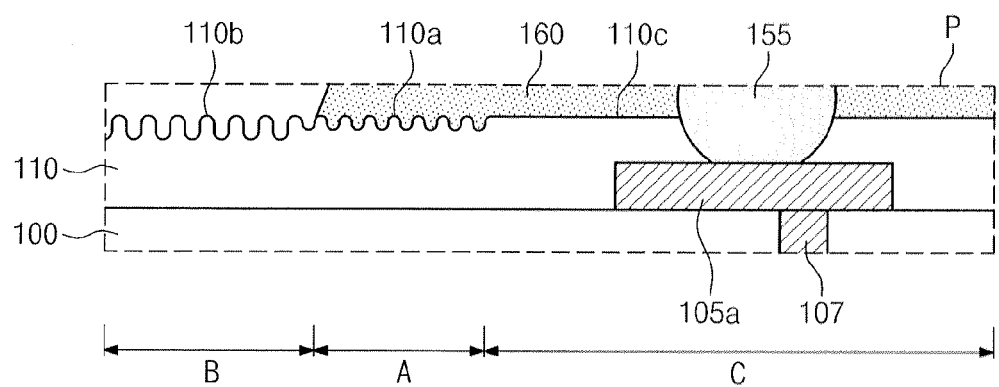
FIG. 2D is a detailed view of portion 'P' of FIG. 2A or FIG. 2B according to another example of the present general inventive concept.
Figure 2E:
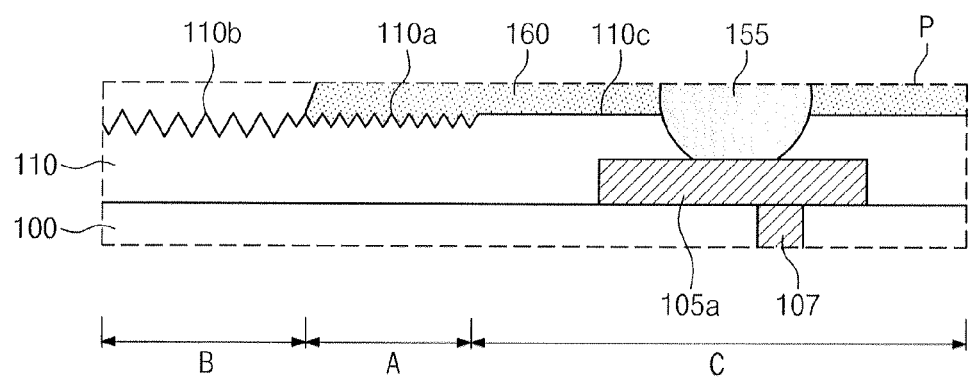
FIG. 2E is a detailed view of portion 'P' of FIG. 2A or FIG. 2B according to still another example of the present general inventive concept.

The first insulating layer 110 has a first surface portion 110a at the first region A, a second surface portion 110b at the second region B, and a third surface portion 110c at the third region C. Referring to FIG. 2C, the respective surface portions 110a, 110b, 110c have a different surface roughness. Preferably, there may not be formed a surface roughness on the third surface portion 110c. In other words, the surface of the third surface portion 110c may be substantially flat. A center line average Ra (or roughness average) of the surface roughness of the first surface portion 110a is preferably about 0.01-0.5 µm, more preferably about 0.086 µm. The center line average Ra is the arithmetic average of the absolute values of peaks and troughs with respect to the mean line of the peaks and troughs of the pitted or rough portion. A value, Ra, can be calculated by the equation:

$$R_a = \frac{1}{n}\sum_{i=1}^{n} |y_i|,$$

where n refers to an ordered, evenly spaced data point along the trace of the roughness profile (as illustrated in FIGS. 2C-2E) having a mean line representing a mean height between the peaks and troughs of the roughness profile; and y refers to the vertical distance from the mean line to the $i^{th}$ data point.

A ten point height Rz of the surface roughness of the first surface portion 110a is preferably about 0.5-3 µm, more preferably about 1.492 µm. A ten point height Rz of the surface roughness of the second surface portion 110b is preferably about 10-100 µm, more preferably about 18 µm. The ten point height is defined as the average height of the five highest local maximums plus the average height of the five lowest local minimums.

Figure 25A:
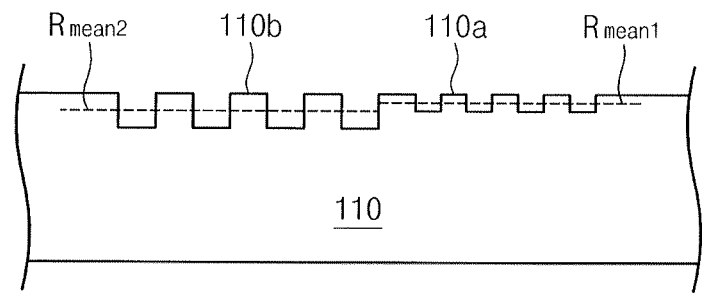
FIGS. 25A-25D illustrate different roughness types of an insulating layer.
Figure 25B:
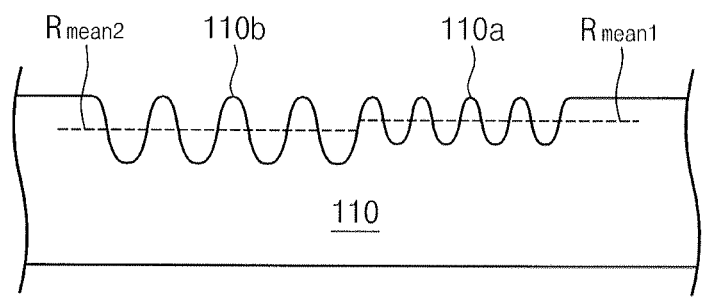

FIGS. 25A-25D illustrate examples of different surface roughnesses according to embodiments of the present general inventive concept. As illustrated in FIG. 25A, the first surface 110a of the first insulating layer 110 may have a mean roughness $R_{mean1}$ and the second surface 110b of the first insulating layer 110 may have a different mean roughness $R_{mean2}$. FIG. 25B illustrates the differing mean roughnesses $R_{mean1}$ and $R_{mean2}$ similar to FIG. 25A, except the form of the surface roughness has a different form. In particular, while the surface roughness of FIG. 25A has a square-wave form that may correspond to lithographic etching, for example, the surface of FIG. 25B has a rounded roughness that may correspond to blasting, for example.

Figure 25C:
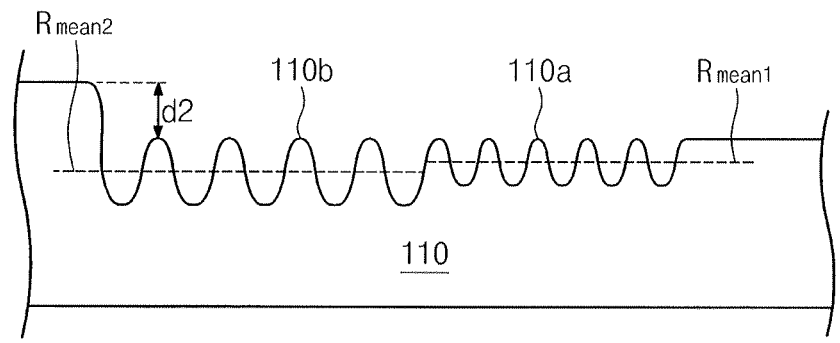
Figure 25D:
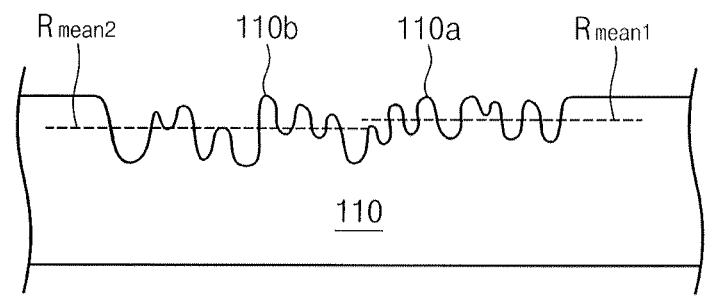

FIG. 25C is similar to FIG. 25B, except the surface roughness is recessed from the upper surface 110d of the first insulating layer 110, so that the peaks of the rough areas 110a and 110b are recessed from the upper surface 110d of the first insulating layer 110 by a distance d2. FIG. 25D illustrates a case in which the distances of the peaks and troughs of the first and second surfaces 110a and 110b from the mean lines $R_{mean1}$ and $R_{mean2}$ may vary from the distances of the other peaks and troughs of the first and second surfaces 110a and 110b, respectively.

The surface roughness of the first insulating layer 110 is different for the respective regions A, B, C, so that the wettability and flowability of the first insulating layer 110 with respect to the epoxy resin solution for the formation of the passivation layer 160 is different for the respective regions A, B, C. That is, the epoxy resin solution has the best flowability at the third region C but has the worst flowability at the second region B. This difference makes it possible to prevent the supplied epoxy resin solution from flowing into an unwanted region (e.g., second region B). By doing so, the epoxy resin can be prevented from covering a surface of the second connection terminal 105b which may lead to an electrical connection failure, for example.

The surface roughness of the regions A, B, and C may be caused by any shape of indentations and protrusions, including indentations with rounded corners, protrusions with rounded edges and indentations with angular corners and protrusions with angular edges. For example, the first or second region A or B may include a plurality of grooves having sides that extend at an angle greater than zero degrees and less than ninety degrees with respect to a top surface 100a of the substrate 100. Alternatively, the sides of the grooves may form ninety-degree angles with respect to the top surface 100a of the substrate 100.

FIG. 2D is a detailed view of portion 'P' of FIG. 2A or FIG. 2B according to another example of the present general inventive concept. FIG. 2E is a detailed view of portion 'P' of FIG. 2A or FIG. 2B according to still another example of the present general inventive concept.

The surface portions 110a, 110b, 110c of the first insulating layer 110 may have a sectional shape similar to a square wave as shown in FIG. 2C, a sectional shape close to a sine wave as shown in FIG. 2D, or a sectional shape similar to a sawtooth wave as shown in FIG. 2E. Alternatively, the surface portions 110a, 110b, 110c of the first insulating layer 110 may have a sectional shape including irregular and various sizes and forms.

Although not shown in the drawings, bumps such as solder balls may be attached to the third connection terminals 115.

Next, a method of manufacturing a semiconductor package according to an embodiment of the present general inventive concept will be described FIGS. 3A-3E, 4A, 5A, and 6A are cross-sectional views illustrating a method of forming a semiconductor package having the section of FIG. 2A according to an example of the present general inventive concept. FIGS. 3F, 4B, 5B, and 6B are detailed views of the portion 'P' of FIGS. 3E, 4A, 5A, and 6A. FIG. 4C is a detailed view of portion 'P1' of FIG. 4B.

Figure 3B:
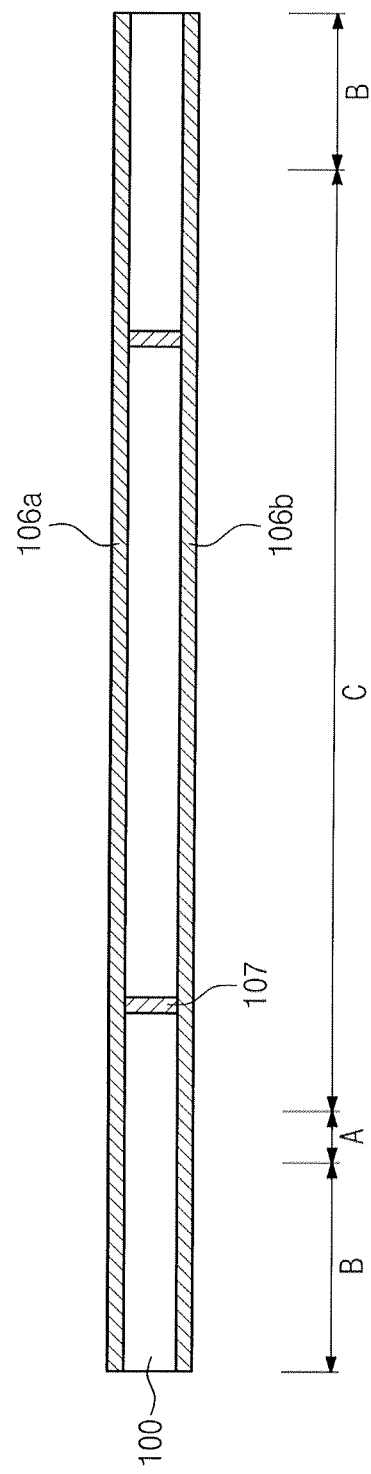
Figure 3C:
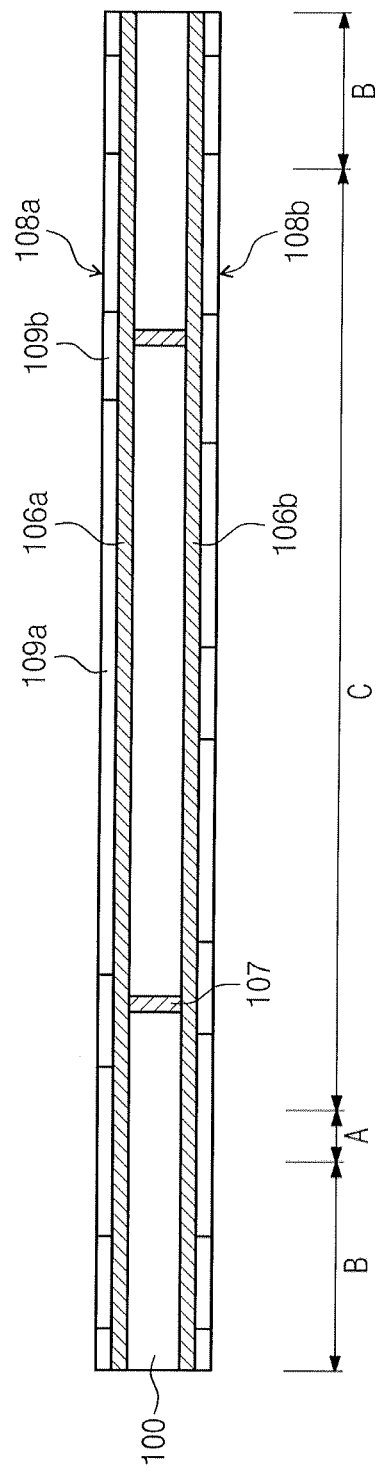

Referring to FIGS. 3A-3E, a substrate body 100 having first to third regions A, B, C and first and second surfaces 100a and 100b is prepared. Metal plates 106a and 106b, for example, a thin copper plate, may be attached on both of the first and second surfaces 100a, 100b of the substrate body 100, respectively. The metal plates may be attached on the substrate body 100 by using a thermo-compression or an adhesive, for example. Vias 107 may be formed in the substrate 100 and filled with a conductive material before applying the metal plates 106a and 106b, as illustrated in FIG. 3A. Alternatively, penetrating holes may be formed in the metal plates and the substrate body 100 disposed between the metal plates 106a and 106b after the metal plates are applied to the substrate 100 by using a laser or drill. Thereafter, a plating layer may be formed on inner walls of the penetrating holes 107 and on the metal plates by using a plating process. The penetrating holes 107 may be filled with a conductive paste material. As illustrated in FIG. 3C, mask patterns 108a and 108b may be applied to the first surface 100a and the second surface 100b of the substrate 100, respectively. As illustrated in FIG. 3D, the metal plates 106a and 106b may be etched by using the mask patterns 108a and 108b as mask patterns to form first and second connection terminals 105a, 105b. The first connection terminal 105a is formed at the first region A and the second connection terminal 105b is formed at the second region B.

Figure 3F:
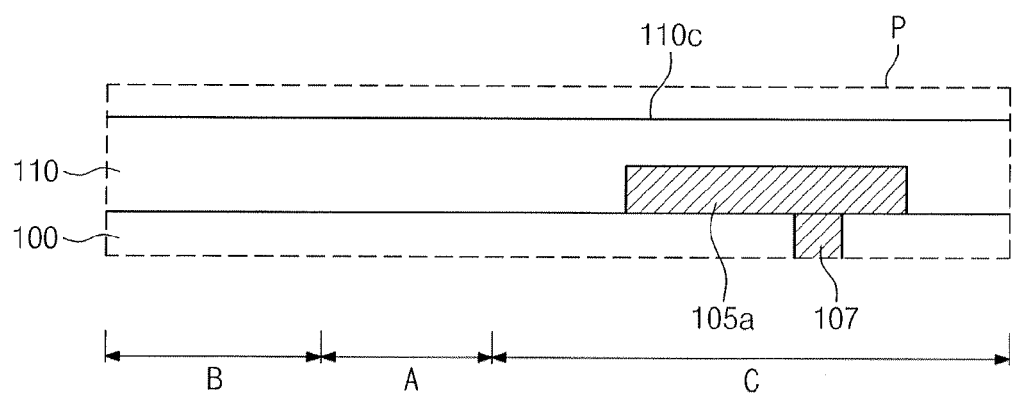
FIGS. 3F, 4B, 5B, and 6B are detailed views of the portion 'P' of FIGS. 3A, 4A, 5A and 6A.

As illustrated in FIG. 3E, a second insulating layer 120 covering the second surface 100b of the substrate body 100 but exposing the third connection terminals 115 is formed. The second insulating layer 120 may be formed, for example, of Photo Solder Resist (RSR), Bismaleimide Triazine (BT) resin or Flame Resistant 4 (FR4) resin. A first insulating layer 110 is formed on an entire surface of the first surface 100a of the substrate body 100. The first insulating layer 110 may be formed of, for example, a positive photosensitive material. The first insulating layer 110 may be formed by spin-coating a positive photosensitive material and soft-baking the spin-coated positive photosensitive material. In this operation, as illustrated in FIG. 3F, a top surface of the first insulating layer 110 is flat regardless of region. At this time, the first insulating layer 110 has a third flat surface portion 110c in the third region.

Figure 4A:
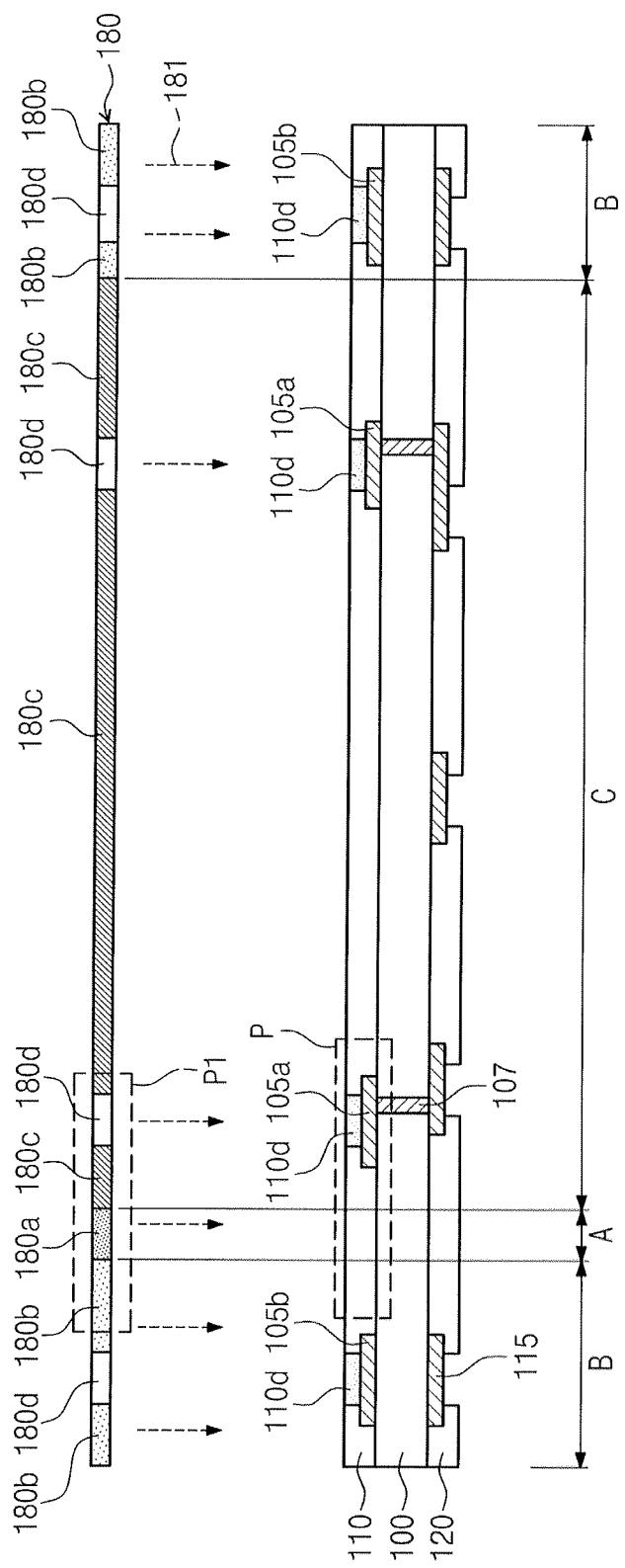
Figure 4B:
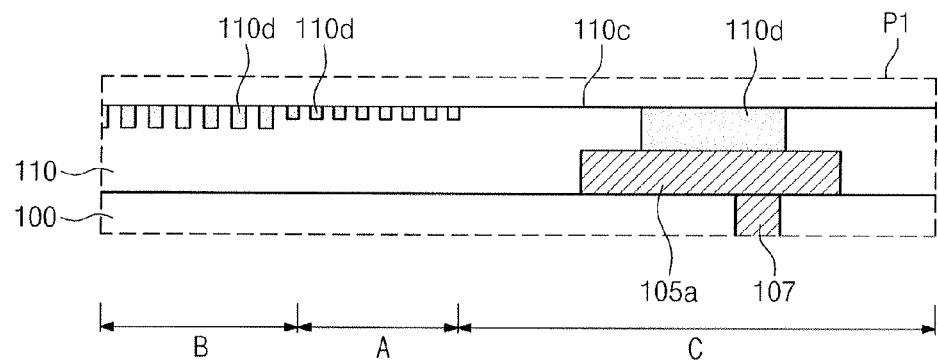
Figure 4C:
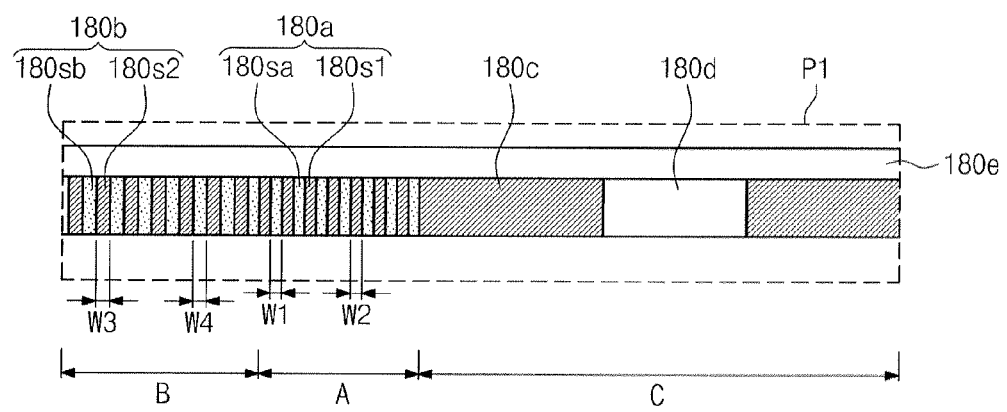
FIG. 4C is a detailed view of portion 'P1' of FIG. 4B.

Referring to FIGS. 4A, 4B and 4C, a gray photomask 180 is positioned over the substrate body 100 on which the first insulating layer 110 is formed. The gray photomask 180 includes first to third portions 180a, 180b, 180c corresponding to the first to third regions A, B, C but having different transmittances. The third portion 180c has a transmittance of about 0% in which light is not transmitted at all. The first portion 180a may include a first sub-transparent part 180sa having a first transmittance, and a first sub-opaque part 180s1 having a transmittance close to 0%. The first sub-transparent part 180sa and the first sub-opaque part 180s1 may be alternatingly and repeatedly arranged. The first sub-transparent part 180sa has a first width W1. The first sub-opaque part 180s1 has a second width. The second portion 180b may include a second sub-transparent part 180sb having a second transmittance, and a second sub-opaque part 180s2 having a transmittance close to 0%.

The second sub-transparent part 180sb and the second sub-opaque part 180s2 may be alternatingly and repeatedly arranged. The second sub-transparent part 180sb has a third width W3. The second sub-opaque part has a fourth width W4. The first and second widths W1 and W2 may be narrower than the third and fourth widths W3 and W4. The first transmittance may be smaller than the second transmittance. The gray photomask 180d may have a fourth portion 180 having a transmittance close to 100% that can completely transmit light. The fourth portion 180d is disposed so as to overlap the first and second connection terminals 105a, 105. The first to fourth portions 180a to 180d may be attached on a transparent substrate 180e. An exposure process for the first insulating layer 110 is performed by irradiating light using the gray photomask 180. Due to the exposure process, portions 110d exposed to light are formed in the first insulating layer 110. The higher the transmittance, the more light reaches the first insulating layer 110, so that a penetrating depth of light penetrating into the first insulating layer 110 increases and thus thicknesses of the portions 110d exposed to light increase. The portions 110d exposed to light are changed to a state easily soluble in a developing solution.

Figure 5A:
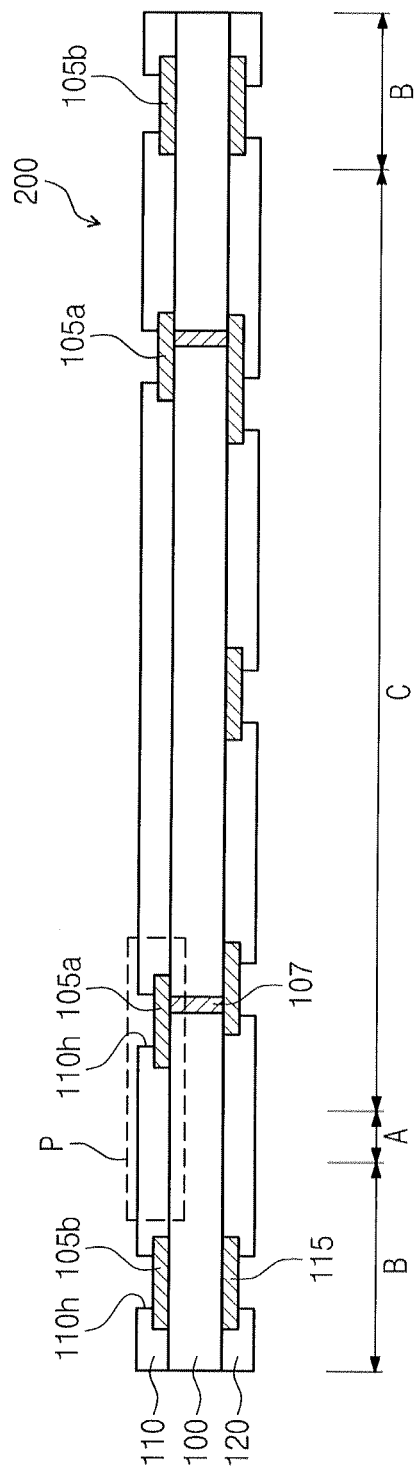
Figure 5B:
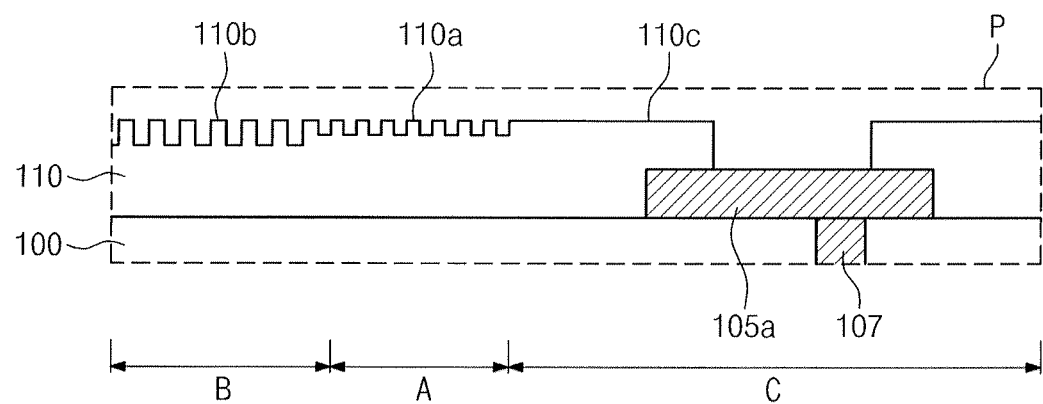

Referring to FIGS. 5A and 5B, the portions 110d exposed to light are removed by using a developing solution. As a result, openings 110h exposing the first and second connection terminals 105a, 105b are formed and at the same time the first insulating layer 110 has a first surface portion 110a and a second surface portion 110b in the first region A and the second region B, respectively. The first surface portion 110a and the second surface portion 110b have surface roughnesses different from each other due to the differing widths and/or transparency of the corresponding portions of the gray mask 180. The surface roughness of the second surface portion 110b may be higher than that of the first surface portion 110a. Preferably, the surface roughness of the third surface portion 110c may be very small or insignificant or about 0 μm.

A center line average Ra (or roughness average) of the surface roughness of the first surface portion 110a is preferably about 0.01-0.5 μm, more preferably about 0.086 μm. A ten point height Rz of the surface roughness of the first surface portion 110a is preferably about 0.5-3 μm, more preferably about 1.492 μm. A ten point height Rz of the surface roughness of the second surface portion 110b is preferably about 10-100 μm, more preferably about 18 μm. The first surface portion 110a may be formed in a U-shape along edges of a semiconductor chip to be mounted later as viewed in the plan view of FIG. 1. The second surface portion 110b may be formed in a closed curve shape enclosing the semiconductor chip to be mounted later. However, the third surface portion 110c may be spaced apart by a first distance D1 from the second surface portion 110b at one end thereof.

Figure 6A:
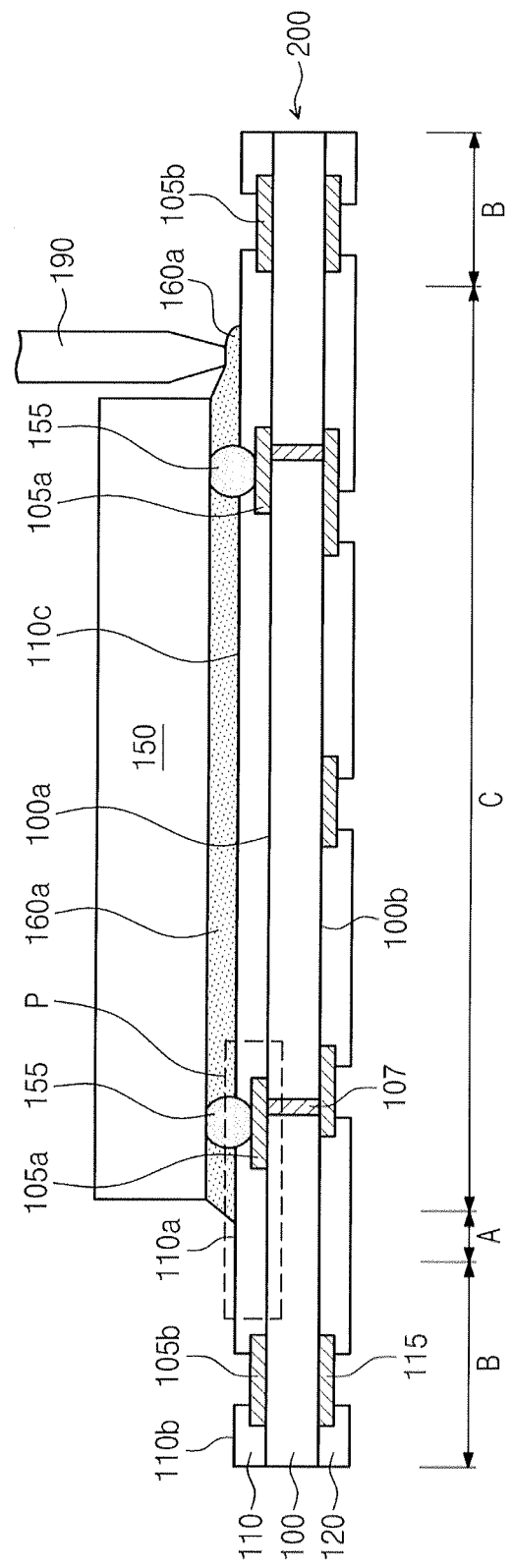
Figure 6B:
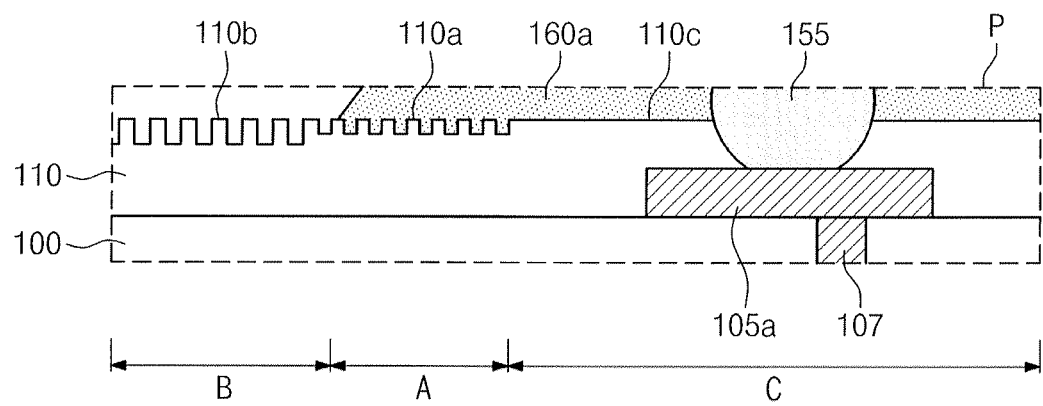

Referring to FIGS. 6A and 6B, a semiconductor chip 150 is mounted on the substrate 200. The semiconductor chip 150 may be mounted in a flip chip bonding on the substrate 200. That is, an external connection terminal 155 protruded downwardly from the semiconductor chip 150 may be fused with the first connection terminal 105a. Otherwise, the external connection terminal 155 may be electrically connected with the first connection terminal 105a through bumps interposed therebetween. After the semiconductor chip 150 is mounted, a nozzle 190 is positioned above the third surface portion 110c adjacent to one side surface of the semiconductor chip 150. An underfill resin solution 160a may be supplied through the nozzle 190 to form a passivation layer. The underfill resin solution 160a flows in between the semiconductor chip 150 and the substrate 200 due to a capillary force. Since the surface roughness of the third surface portion 110c is close to 0 μm, the flowability of the underfill resin solution 160a is very good and thus a space between the third surface portion 110c and the semiconductor chip 150 is rapidly filled with the underfill resin solution 160a. Also, the first surface portion 110a attracts the underfill resin solution 160a to an extent.

However, the first surface portion 110a has lower wettability and worse flowability than the third surface portion 110c, so that the underfill resin solution 160a stops on the first surface portion 110a and does not flow any more. Even if a part of the underfill resin solution 160a were to flow over the first surface portion 110a, since the second surface portion 110b has a high surface roughness to such a degree that can block the flow of the underfill resin solution 160a, the underfill resin solution 160a would not flow into the second surface portion 110b but would be stopped at the edge of the first surface portion 110a or at the edge of the second surface portion 110b adjacent to the first surface portion 110a. Consequently, the semiconductor package does not need a dam structure or the like to block the flow of the underfill resin solution, and a region occupied by the dam structure or the like may be excluded. Therefore, a horizontal/vertical size of the semiconductor package can be decreased, a region for re-wiring can be secured, and the semiconductor package can be protected from external moisture or contamination.

After applying the resin solution 160a, a hardening process is performed to harden the underfill resin solution 160a, to form a passivation layer 160 shown in FIGS. 2A and 2B. Additionally, since the first surface portion 110a has a rough surface, the surface area thereof increases, so that an adhesive force between the passivation layer 160 and the first surface portion 110a can be enhanced. Therefore, the reliability of the semiconductor package can be enhanced.

Figure 7A:
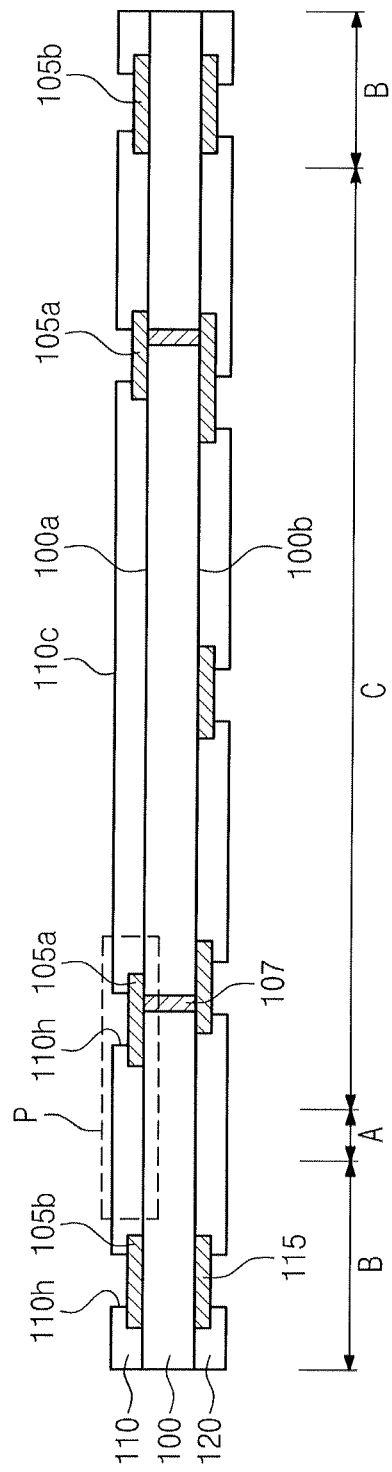
FIGS. 7A, 8A, and 9A are cross-sectional views illustrating a method of forming a semiconductor package having the section of FIG. 2A according to an example of the present general inventive concept.
Figure 7B:
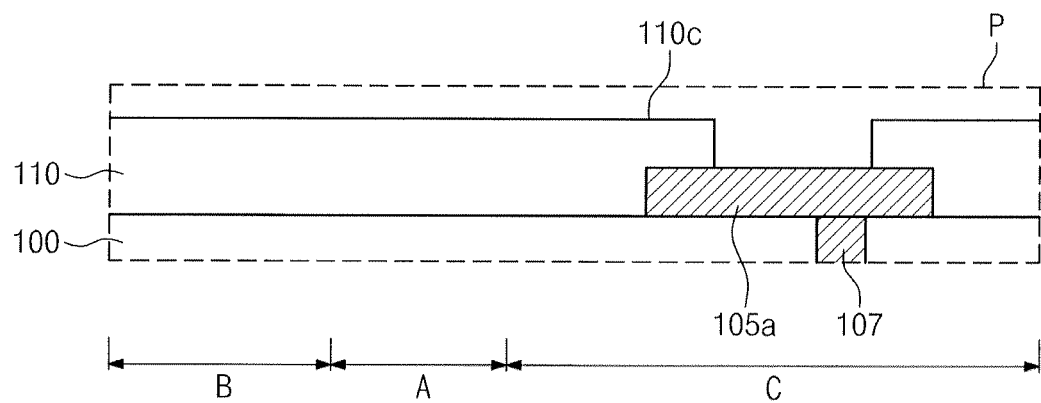
FIGS. 7B, 8B, 9B, and 9C are detailed views of the portion 'P' of FIGS. 7A, 8A, 9A and 6A.
Figure 8A:
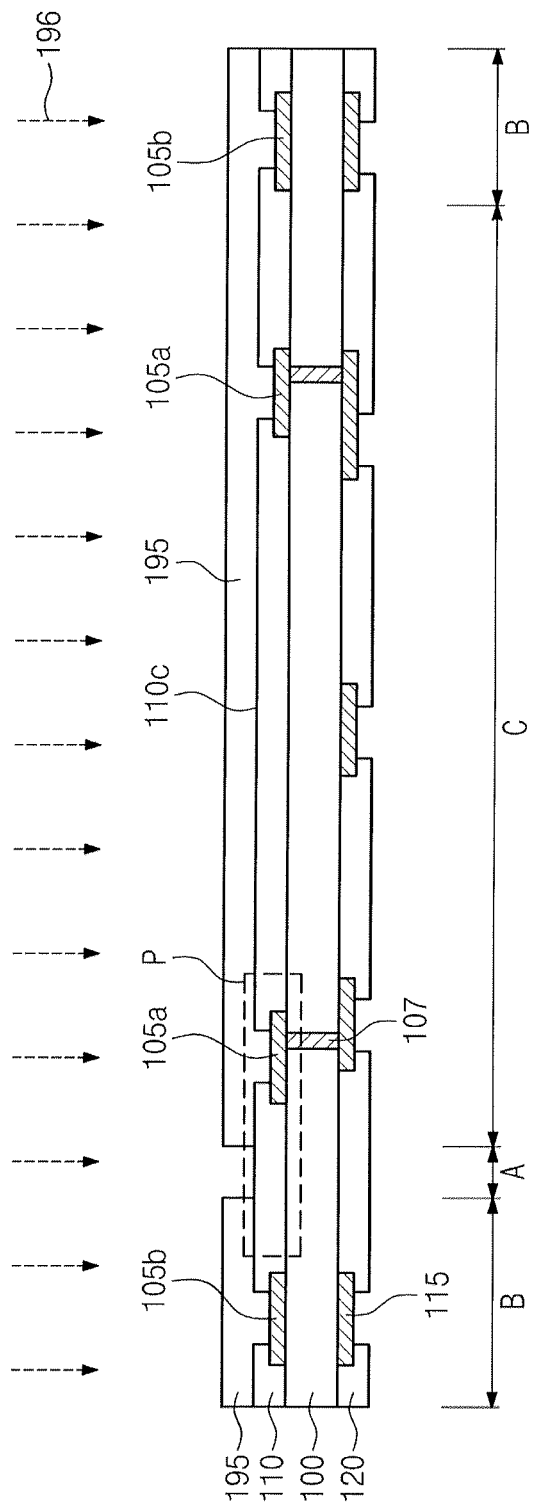
Figure 8B:
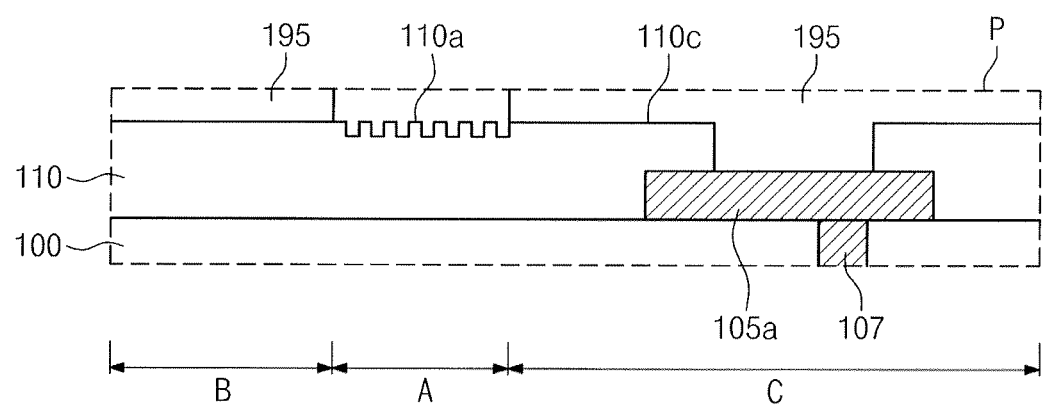
Figure 9A:
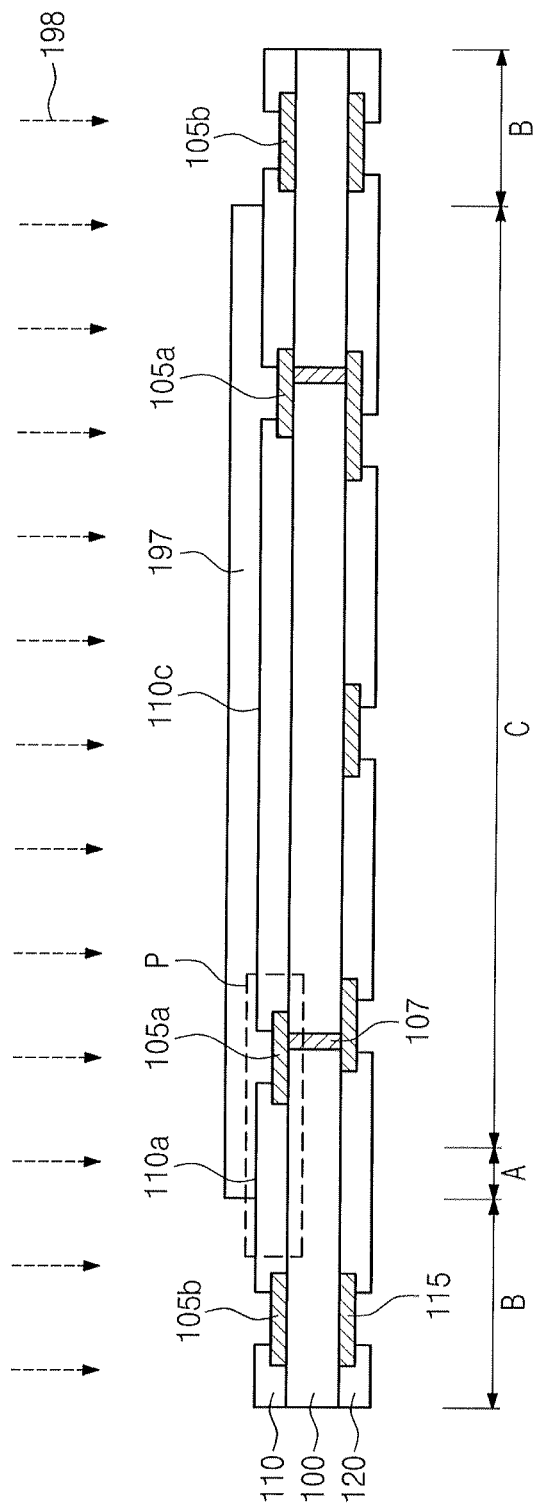
Figure 9B:
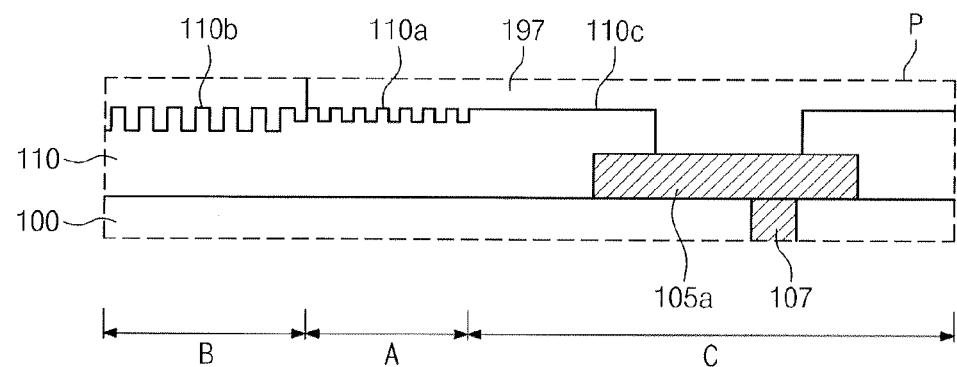

FIGS. 7A, 8A, and 9A are cross-sectional views illustrating a method of forming a semiconductor package having the section of FIG. 2A according to an example of the present general inventive concept. FIGS. 7B, 8B and 9B are detailed views of the portion 'P' of FIGS. 7A, 8A, 9A, and 6A.

Referring to FIGS. 7A and 7B, a second insulating layer 120 is formed on a second surface 100b of a substrate body 100. Thereafter, a first insulating layer 110 having openings 110h exposing first and second connection terminals 105a, 105b is formed on a first surface 100a of the substrate body 100. The first insulating layer 110 is formed to have a flat surface across the entire surface. The first insulating layer 110 is formed to have a third surface portion 110c at a third region C.

Referring to FIGS. 8A and 8B, a first mask pattern 195 exposing a first region A but covering a second region B and the third region C is formed on the first insulating layer 110. Thereafter, a first blast process 196 is performed by using the first mask pattern 195. The first blast process 196 may be performed, for example, by spraying a mixed solution onto the substrate 200 at a high pressure, the mixed solution being obtained by mixing rigid particles such as sand particles having a fine size in an etchant that can etch the substrate. Otherwise, the first blast process 196 may be performed by colliding only the foregoing fine and rigid particles without any etchant with a target surface of the substrate at a high pressure. At this time, it may be possible to adjust the surface roughness by controlling types of etchants and sizes of particles. A first surface portion 110a having a predetermined roughness is formed in the first insulating layer 110 at the first region A by the first blast process 196.

Referring to FIGS. 9A and 9B, the first mask pattern 195 is removed. Thereafter, a second mask pattern 197 exposing the second region B but covering the first region A and the third region C is formed on the first insulating layer 110. The second mask pattern 197 also covers the top surface of the first connection terminal 105a. A second blast process 198 is performed by using the second mask pattern 197. The second blast process 198 may be performed similarly to the first blast process 196 or may be performed by using particles having a size greater than the particles used in the first blast process 196 at a pressure higher than the pressure used in the first blast process 196. By doing so, a second surface portion 110b is formed in the first insulating layer 110 at the second region B. The surface roughness of the second surface portion 110b may be higher than that of the first surface portion 110a. The second mask pattern 197 is removed. Thereafter, an underfill resin solution 160a may be supplied and hardened to form a semiconductor package. The mask patterns 195, 197 may be shadow mask or photoresist patterns.

Figure 9C:
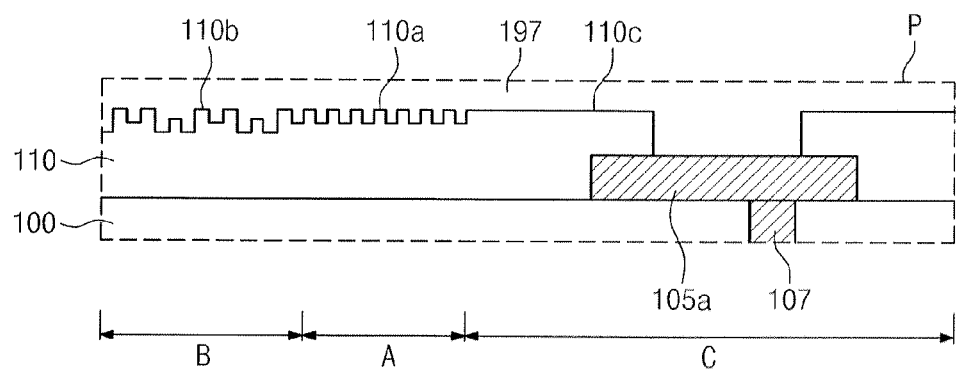

The order in which the first blast process 196 and the second blast process 198 are performed may be reversed. For example, the first blast process 196 and the second blast process 198 may be overlapped. In detail, the second blast process 198 may be firstly performed with respect to the second region B exposed by using the second mask pattern 197, and then, the first blast process 196 may be performed with respect to the first region A and the second region by exposing them. In this case, as shown in FIG. 9C, both a first surface roughness and a second surface roughness which is different from the first surface roughness may be formed to be overlapped to each other at the second region B.

During the second blast process 198, by forming the mask patterns 195 and 197 to have an opening exposing the first and second connection terminals 105a and 105b, it is possible to form surface roughnesses at the first and second connection terminals 105a and 105b.

Figure 10:
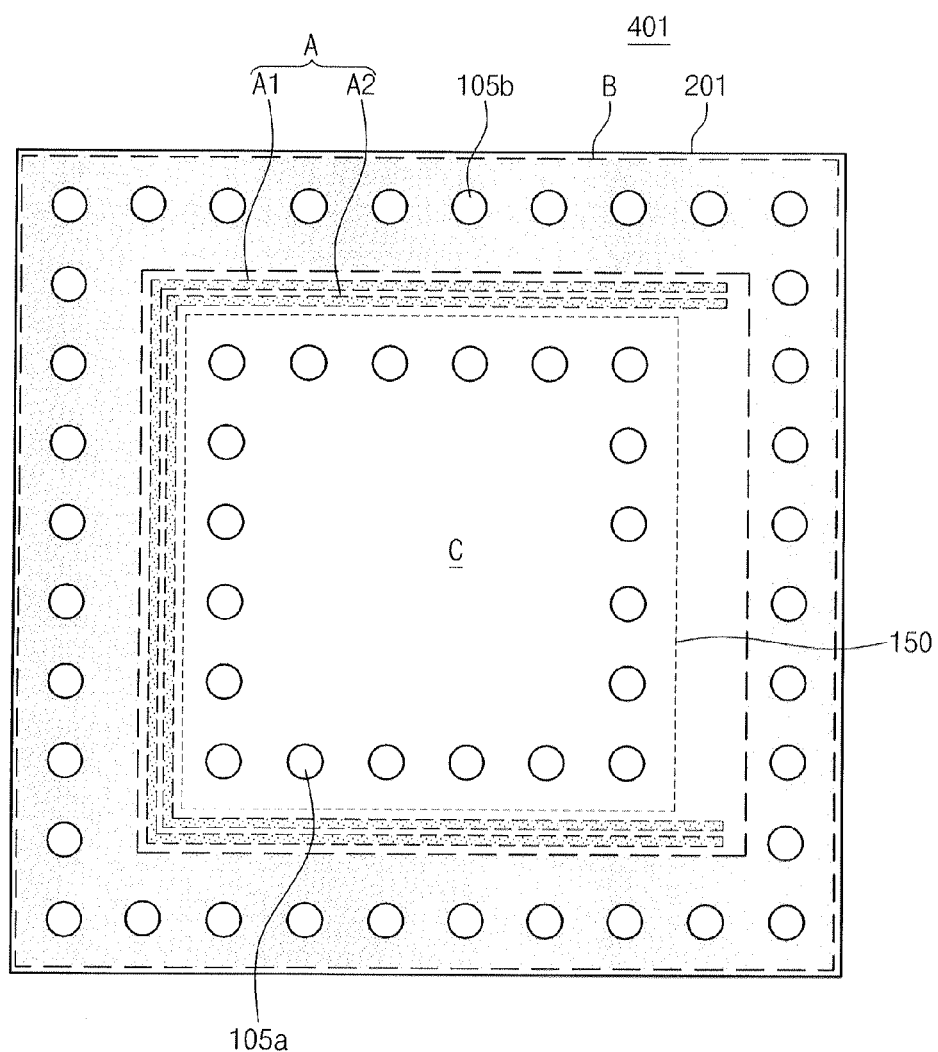
FIG. 10 is a layout diagram of a semiconductor package according to another embodiment of the present general inventive concept.

FIG. 10 is a layout diagram of a semiconductor package according to another embodiment of the present general inventive concept.

Referring to FIG. 10, in a substrate 201 included in a semiconductor package 401, a first region A may be divided into a plurality of regions. That is, the first region A may include a first sub-region A1 and a second sub-region A2. The first sub-region A1 and the second sub-region A2 may be separated from the first connection terminal 105a by a predetermined distance. In other words, if the substrate 201 includes a plurality of first connection terminals 105a arranged in a particular pattern to correspond to electrical connections of a semiconductor chip, then the first region A including sub-regions A1 and A2 may be arranged around an outside circumference of the pattern of first connection terminals 105a. The first sub-region A1 and the second sub-region A2 both may have a U-shape, or it may be designed such that the first sub-region A1 encloses the second sub-region A2. Methods of forming the semiconductor package 401 and the features of the semiconductor package 401 may be similar to those described in FIGS. 1-9B.

Figure 11A:
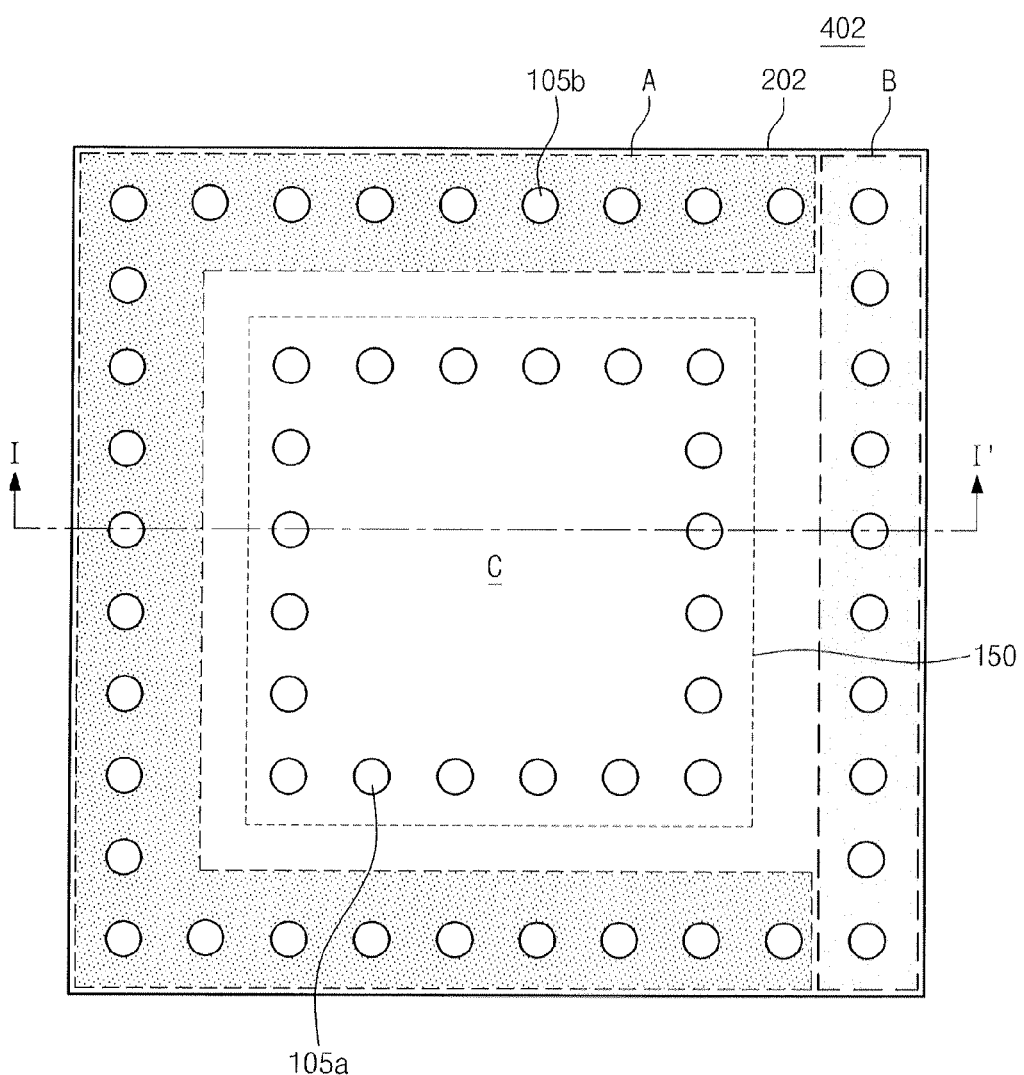
FIG. 11A is a layout diagram of a semiconductor package according to another embodiment of the present general inventive concept.
Figure 11B:
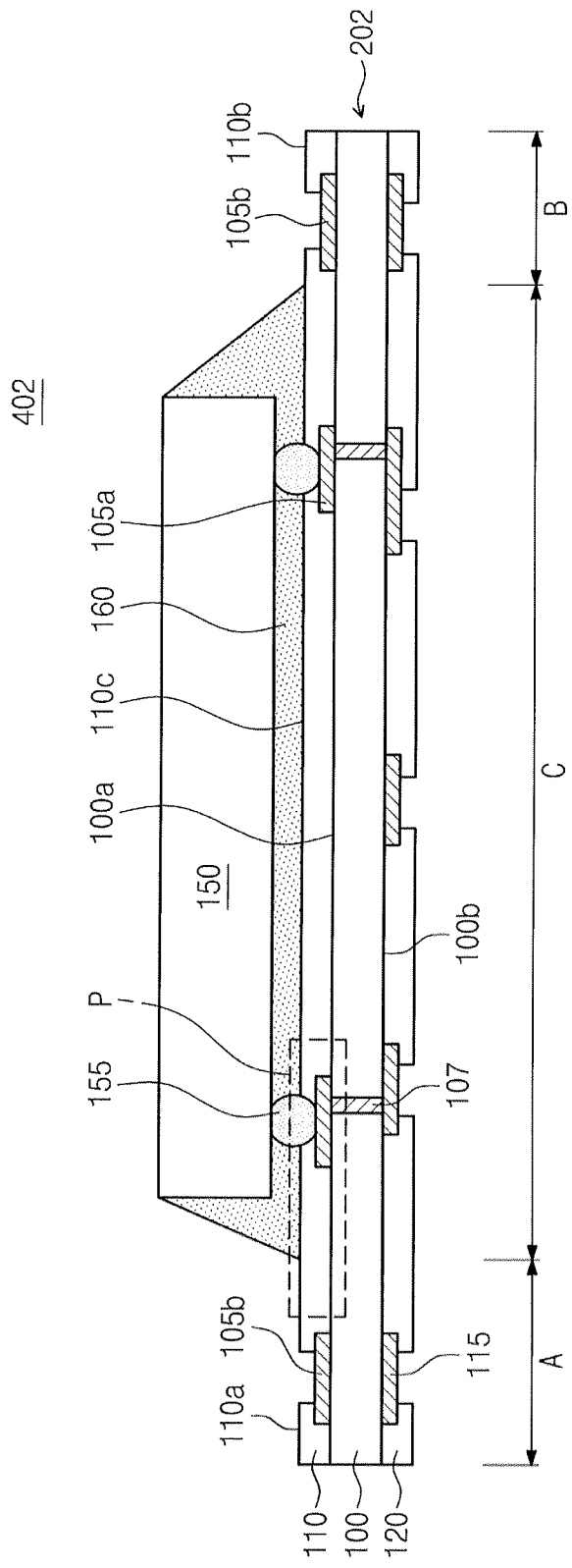
FIG. 11B is a cross-sectional view taken along line I-I' of FIG. 11A.

FIG. 11A is a layout diagram of a semiconductor package according to an embodiment 3 of the present general inventive concept. FIG. 11B is a cross-sectional view taken along line I-I' of FIG. 11A.

Referring to FIGS. 11A and 11B, in a substrate 202 included in a semiconductor package 402, a first region A may have a U-shape to enclose the semiconductor chip 150. The first region A may be formed at a region overlapping with the second connection terminal 105b along an edge of the substrate 202 and at a region between the semiconductor chip 150 and the second connection terminal 105b. A second region B may be disposed in a bar shape at one end of the first region A. The second region B may be formed at a region overlapping with the second connection terminal 105b along an edge of the substrate 202 and at a region between the semiconductor chip 150 and the second connection terminal 105b. As discussed above with respect to FIG. 6A, for example, while the semiconductor package 402 is fabricated, an underfill resin solution 160a is supplied between the semiconductor chip 150 and the second region B, and the underfill resin solution flows in a space between the semiconductor chip 150 and the substrate 202 but does not flow toward the second region B since a surface roughness at the second region B is sufficient to prevent the flow of the underfill resin solution 160a. Also, the flow of the underfill resin solution 160a is stopped at a boundary between the first region A and the third region C since a surface roughness is also formed in the first region A to an extent that the underfill resin solution 160a does not flow. The first region A and the second region B may be formed to be overlapped with the second connection terminals 105b along an edge of the semiconductor package or formed at a space between the semiconductor chip mounting region 150 and the first and second connection terminals 105*a* and 105*b*. Methods of forming the semiconductor package 402 and the features of the semiconductor package 402 may be similar to those described in FIGS. 1-9B.

Figure 12:
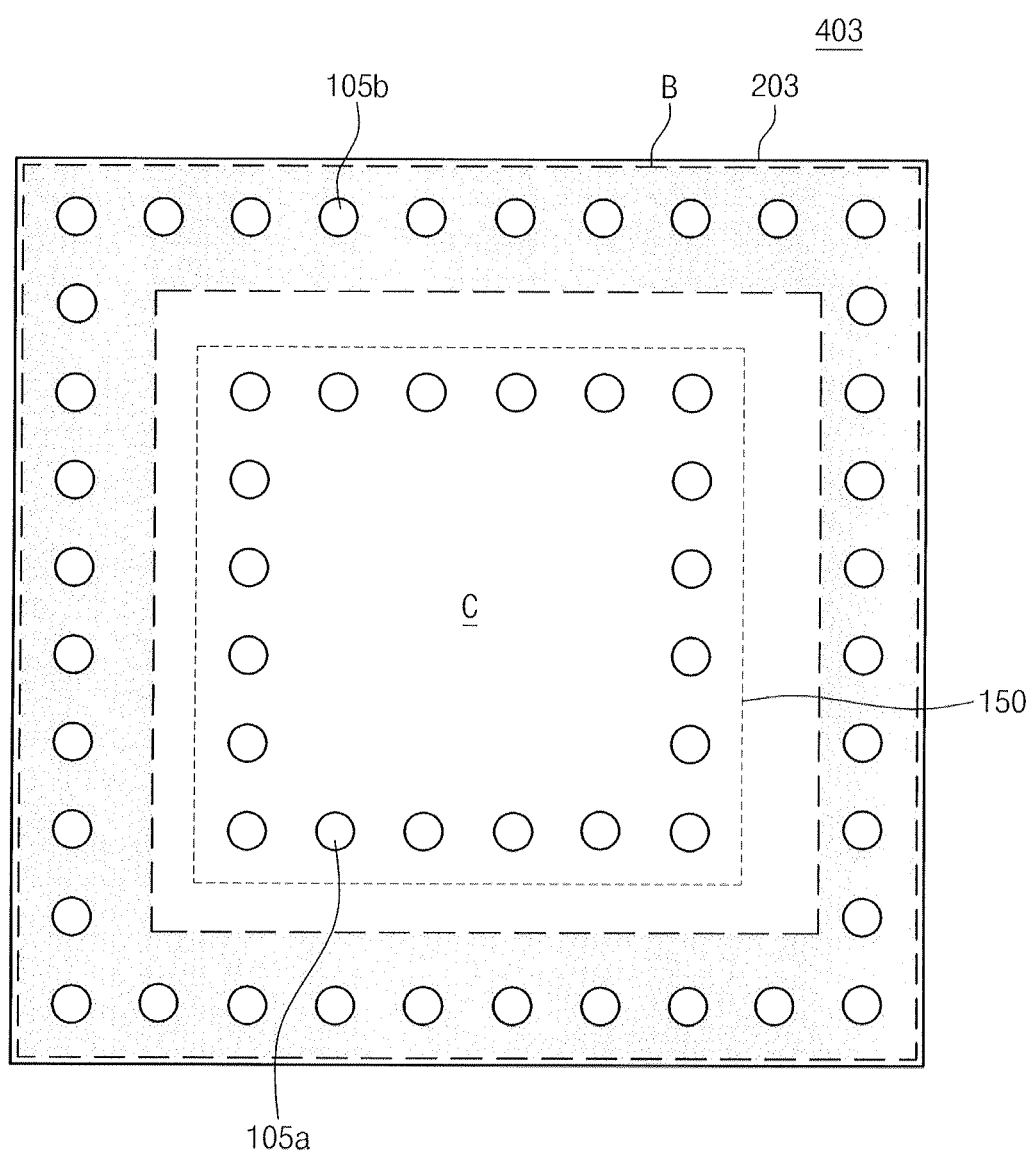
FIG. 12 is a layout diagram of a semiconductor package according to another embodiment of the present general inventive concept.

FIG. 12 is a layout diagram of a semiconductor package according to an embodiment 4 of the present general inventive concept.

Referring to FIG. 12, a substrate 203 included in a semiconductor package 403 according to another embodiment of the present general inventive concept does not include the first region A, described previously, but only the second region B, to have a closed loop surrounding the semiconductor chip 150 along an edge of the substrate 203 and to be spaced apart from the semiconductor chip. Methods of forming the semiconductor package 403 and the features of the semiconductor package 403 may be similar to those described in FIGS. 1-9B.

Although FIG. 12 illustrates a closed loop of the second region B not having the first region A in the present embodiment, it is possible for the first region A to be formed in a closed loop not having the second region B, similar to FIG. 12.

Figure 13A:
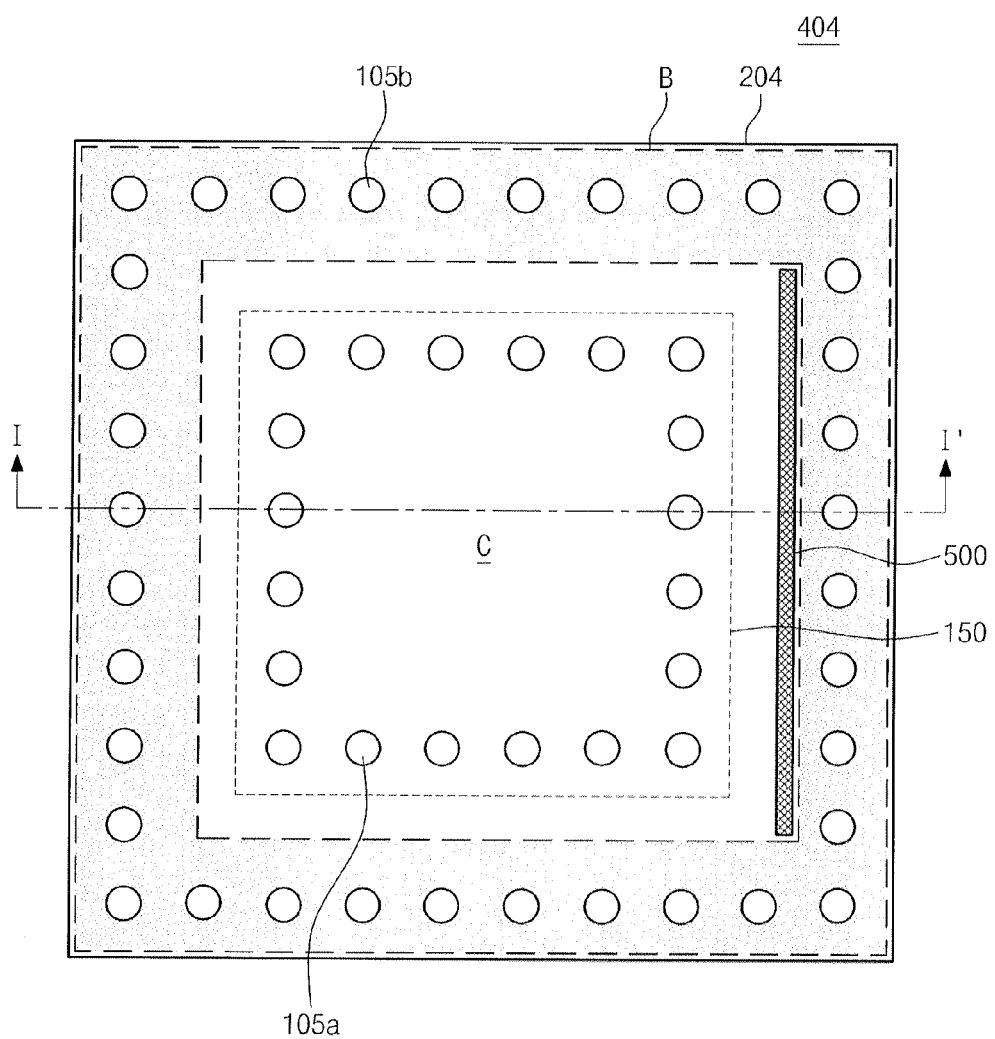
FIG. 13A is a layout diagram of a semiconductor package according to another embodiment of the present general inventive concept.
Figure 13B:
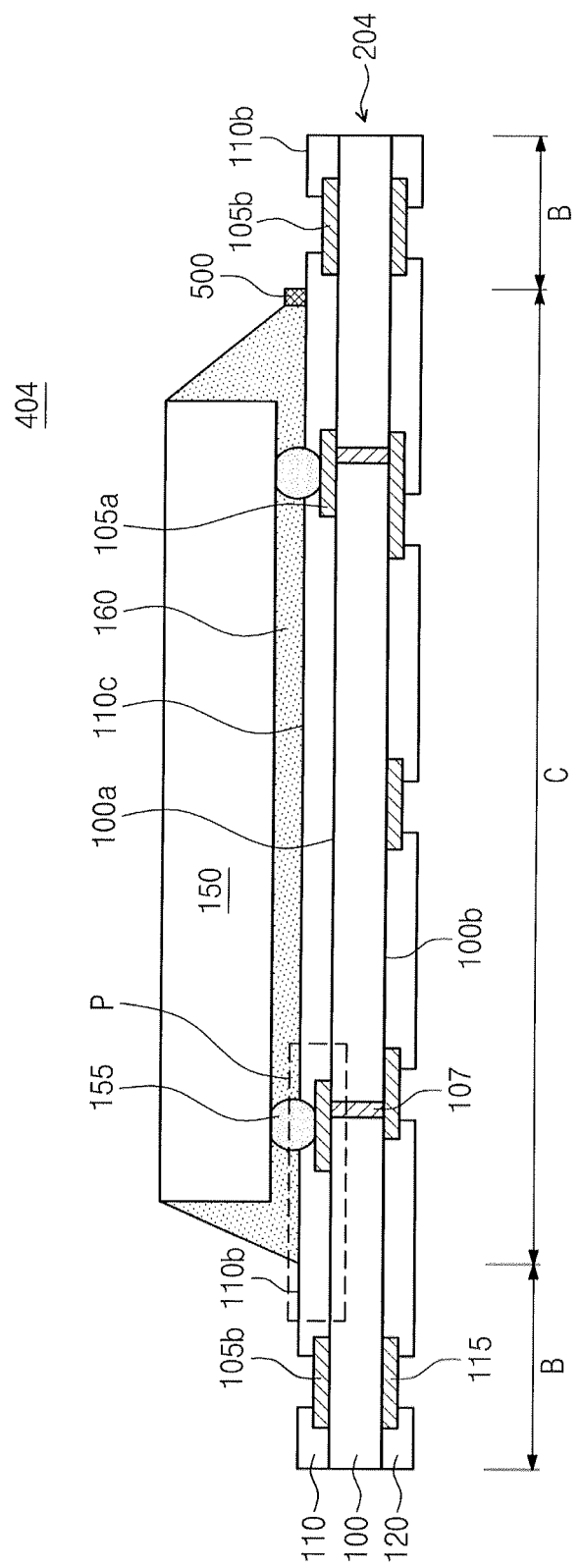
FIG. 13B is a cross-sectional view taken along line II-II' of FIG. 13A.

FIG. 13A is a layout diagram of a semiconductor package according to another embodiment of the present general inventive concept. FIG. 13B is a cross-sectional view taken along line II-II' of FIG. 13A.

Referring to FIGS. 13A and 13B, a substrate 204 included in a semiconductor package 404 includes a second region B of a closed loop that is formed without a first region A. Additionally, a dam 500 may be disposed to have a bar shape between a third region C and the second region B adjacent to a location where an epoxy resin solution is injected by a nozzle. The dam 500 may be formed in any of the semiconductor packages 400, 401, 402, and 403 of FIGS. 1, 10, 11A, and 12, respectively. Since the dam 500 is located only at a location adjacent to a region where the epoxy resin solution is injected, including the surfaces A and B having different roughnesses can reduce an area occupied by the dam, compared to a package structure having a dam located at both sides of a semiconductor chip or surrounding a semiconductor chip. Similar to the configuration described above with respect to FIGS. 1 and 2A, a first connection terminal 105*a* and a second connection terminal 105*b* are disposed on the first surface 100*a*. The first connection terminal 105*a* may be disposed on the third region C. The second connection terminal 105*b* may be disposed on the second region B and be spaced apart from the first connection terminal 105*a*. Third connection terminals 115 may be disposed on the second surface 100*b*.

Figure 14:
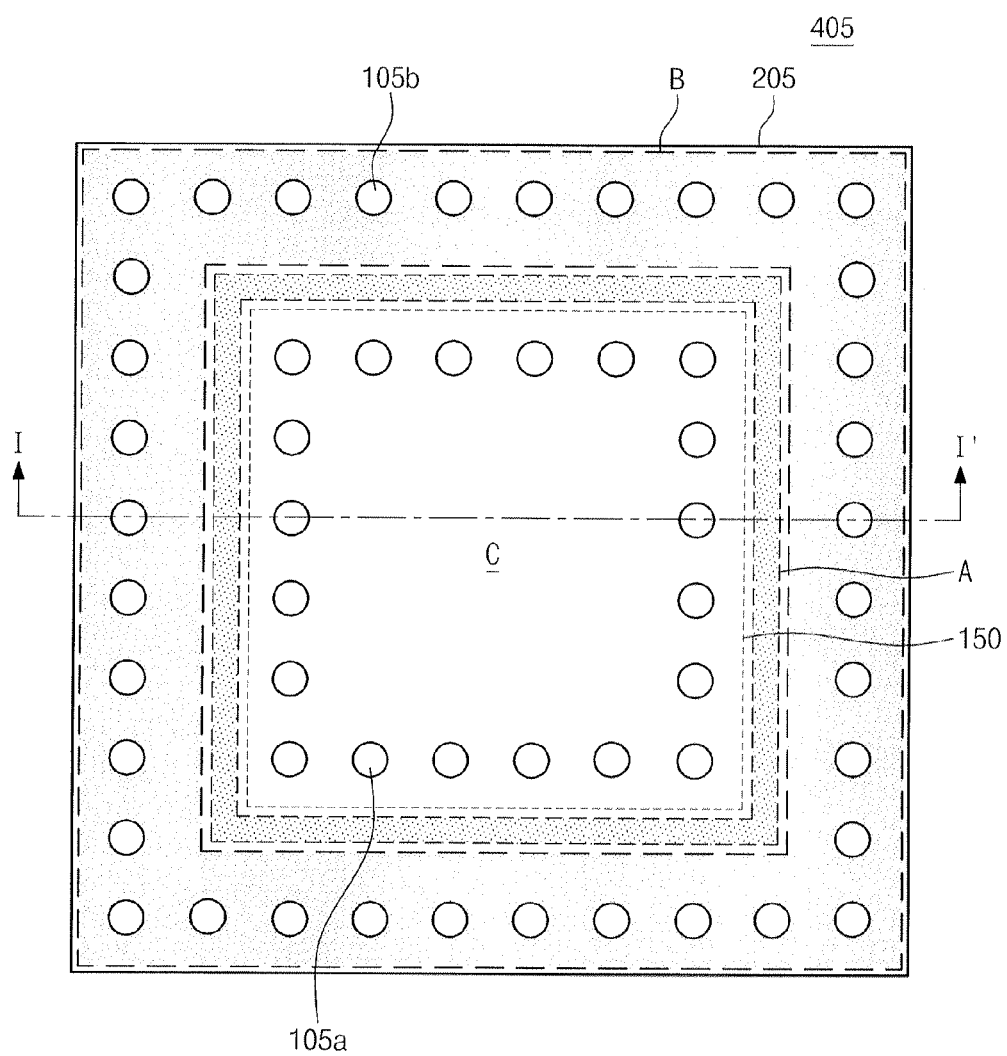
FIG. 14 is a layout diagram of a semiconductor package according to another embodiment of the present general inventive concept.
Figure 15B:
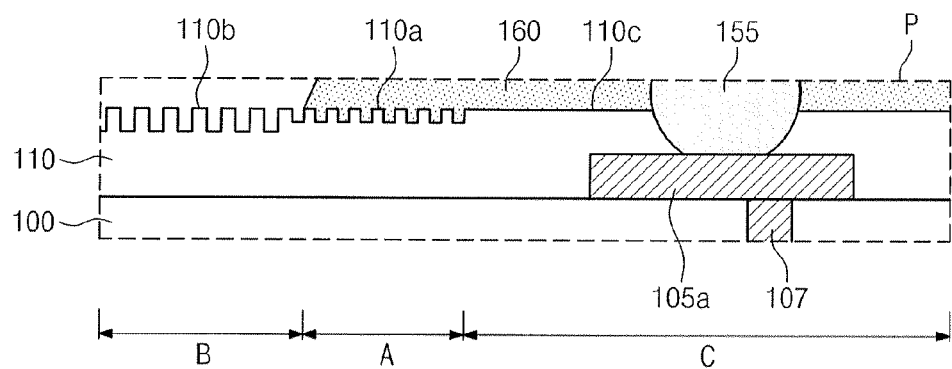
FIG. 15B is a detailed view of the portion 'P' of FIG. 15A.

FIG. 14 is a layout diagram of a semiconductor package according to another embodiment of the present general inventive concept. FIG. 15A is a cross-sectional view taken along line I-I' of FIG. 14. FIG. 15B is a detailed view of the portion 'P' of FIG. 15A.

Referring to FIGS. 14, 15A, and 15B, a substrate 205 included in a semiconductor package 405 includes a first region A having a shape of a closed loop adjacent to an edge of a semiconductor chip 150, and a second region B having a shape of a closed loop surrounding the first region A. A third region C is disposed inside of the first region A. Methods of forming the semiconductor package 405 and the features of the semiconductor package 405 may be similar to those described in FIGS. 1-9B.

A method of fabricating the semiconductor package 405 is explained as follows.

Figure 16A:
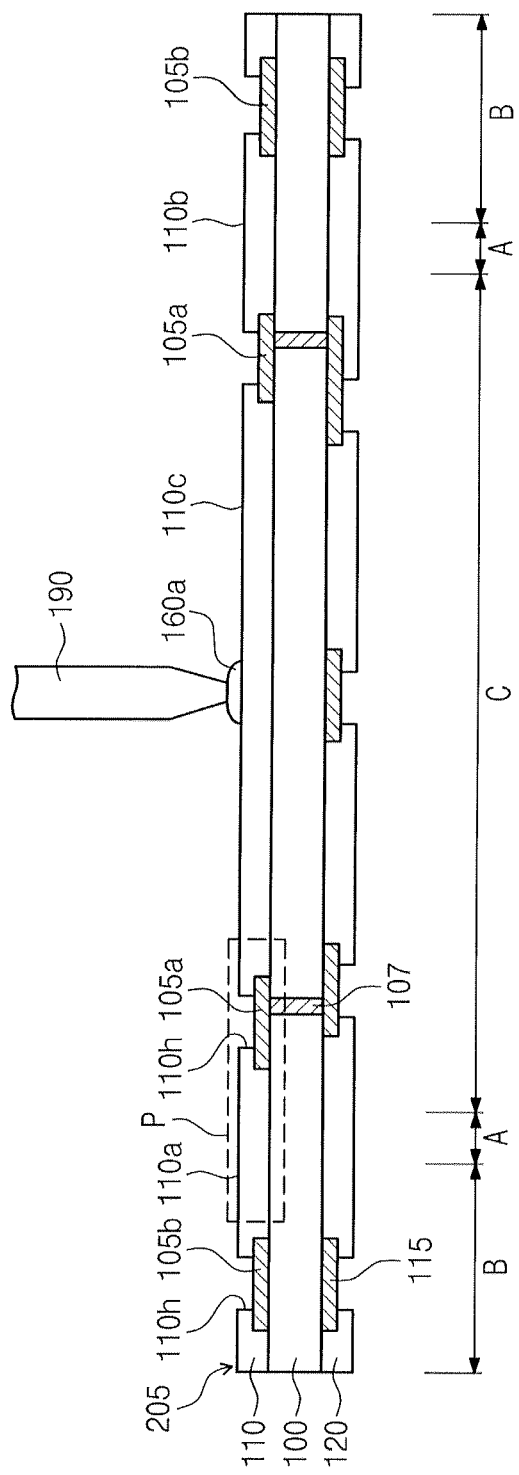
FIG. 16A is a cross-sectional view showing a process of forming a semiconductor package having a cross-sectional view of FIG. 15A.
Figure 16B:
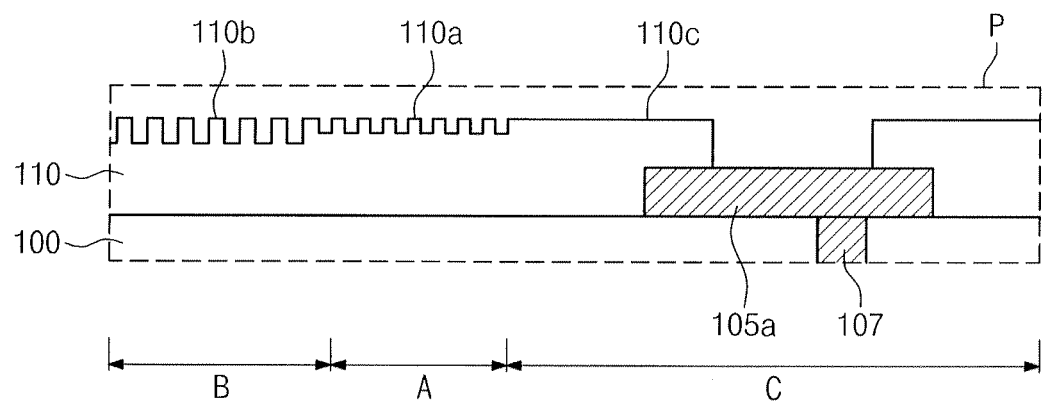
FIG. 16B is a detailed view of the portion 'P' of FIG. 16A.

FIG. 16A is a cross-sectional view showing a process of forming a semiconductor package having a cross-sectional view of FIG. 15A. FIG. 16B is a detailed view of the portion 'P' of FIG. 16A.

Referring to FIGS. 16A and 16B, a substrate 205 is formed in a method similar to that of any of FIGS. 1-9. Then, before mounting a semiconductor chip 150, a nozzle 190 is located at a center of the substrate 205, and an underfill resin solution 160*a* is supplied. The underfill resin solution 160*a* rapidly flows from a third surface portion 110*c* to a first surface portion 110*a* to cover the third surface portion 110*c* but to stop at the first surface portion 110*a*. Even if the underfill resin solution 160*a* flows over the first surface portion 110*a*, the underfill resin solution 160*a* does not flow into the second surface portion 110*b*. Next, again referring to FIGS. 15A and 15B, the semiconductor chip 150 is mounted on the substrate 205 in a flip chip bonding. At this time, the underfill resin solution 160*a* existing between the external connection terminal 155 and the first connection terminal 105*a* escapes to the outside and thus a contact failure between the external connection terminal 155 and the first connection terminal 105*a* does not occur.

Figure 17:
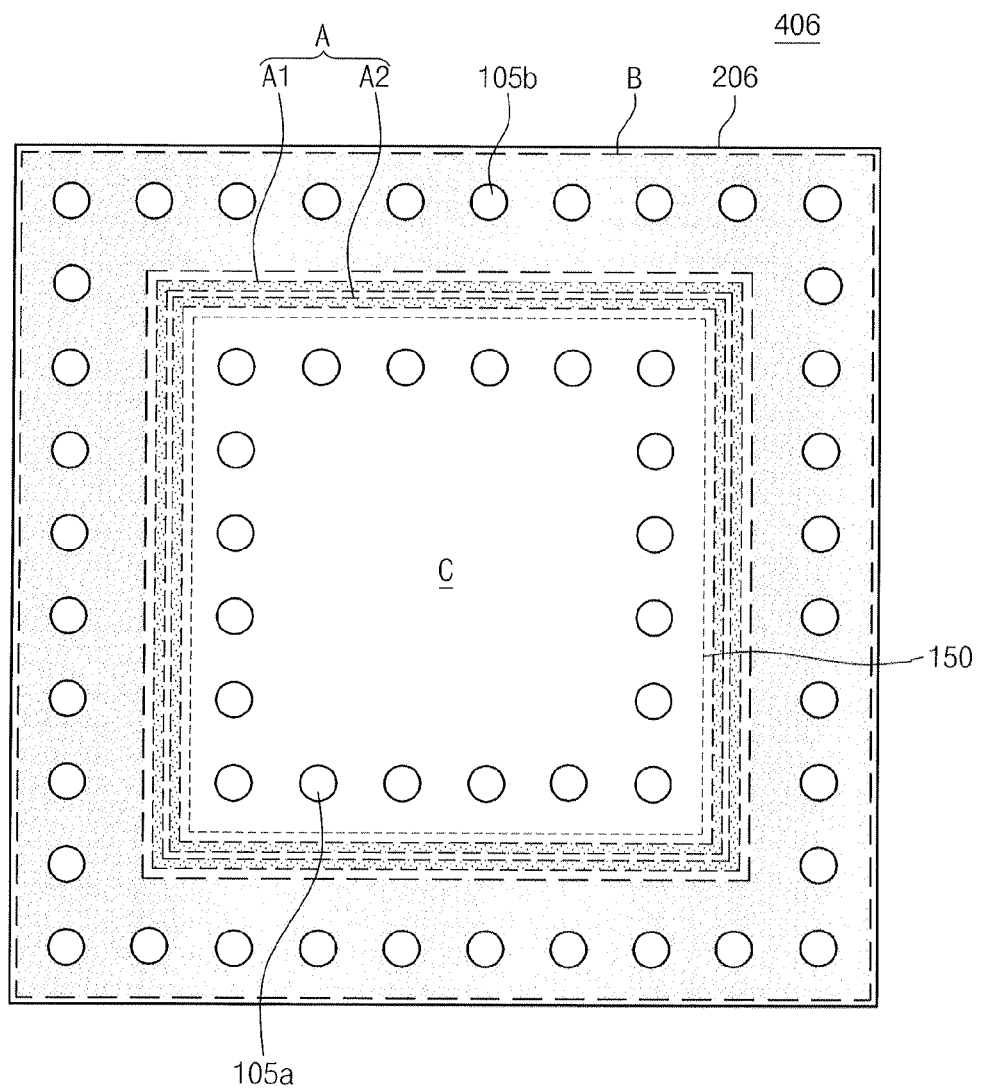
FIG. 17 is a layout diagram of a semiconductor package according to another embodiment of the present general inventive concept.

FIG. 17 is a layout diagram of a semiconductor package according to another embodiment of the present general inventive concept.

Referring to FIG. 17, a substrate 206 included in a semiconductor package 406 includes a first region A may be formed outside of a region where a semiconductor chip 150 is mounted and a second region B may be formed to surround the first region A. The first region A may be divided into a plurality of regions. That is, the first region A may include a first sub-region A1 and a second sub-region A2. The first sub-region A1 and the second sub-region A2 may not overlap the first connection terminal 105*a*. In other words, if the semiconductor package 406 includes a plurality of first connection terminals 105*a* arranged in a pattern to correspond to terminals of a semiconductor chip, then the first region A including the first and second sub-regions A1 and A2 may be located around an outer circumference of the pattern of first connection terminals 105*a*. The first sub-region A1 and the second sub-region A2 both may have a shape of a closed loop surrounding the semiconductor chip 150, or may be designed such that the first sub-region A1 encloses the second sub-region A2.

Figure 18:
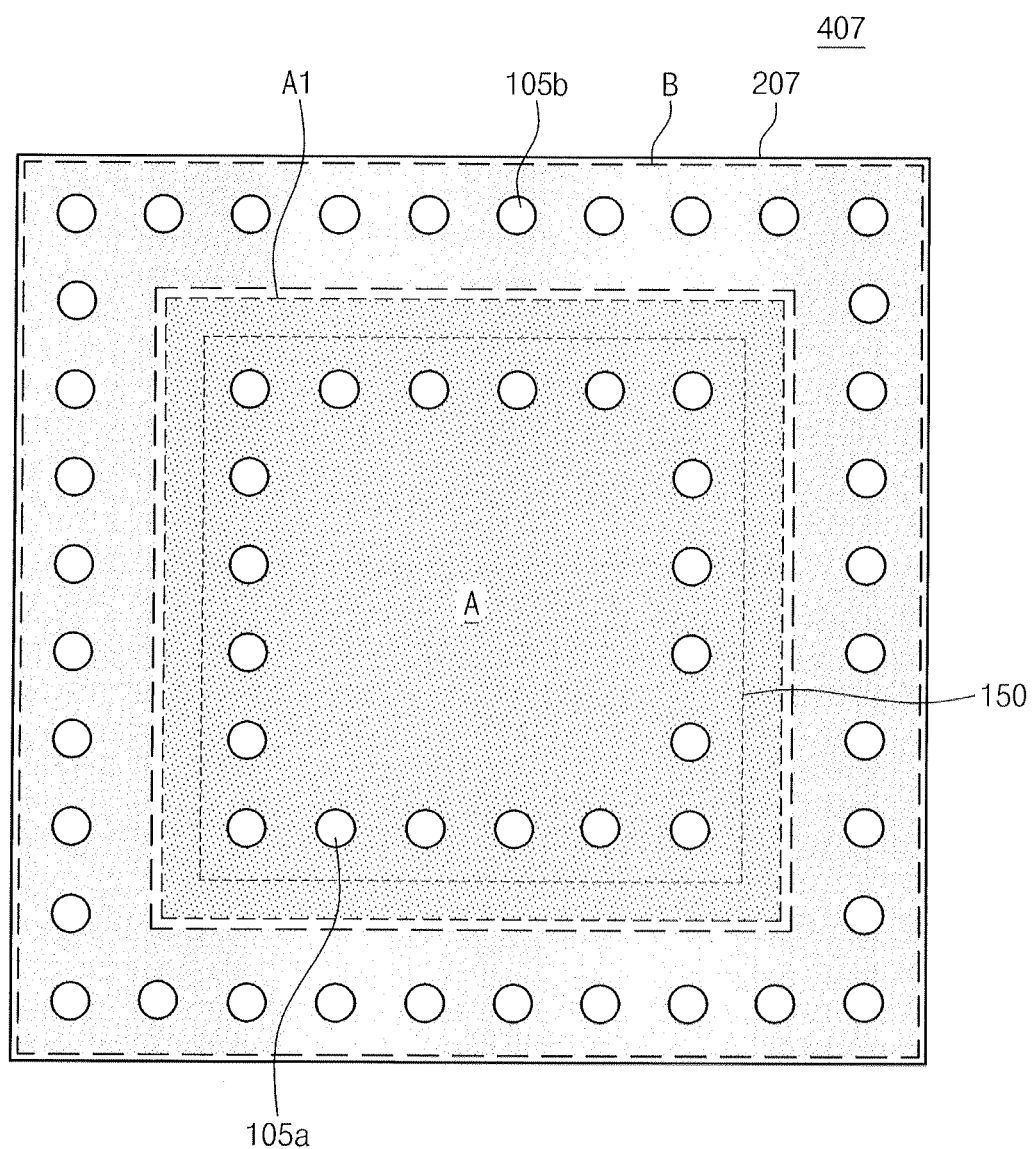
FIG. 18 is a layout diagram of a semiconductor package according to another embodiment of the present general inventive concept.

FIG. 18 is a layout diagram of a semiconductor package according to another embodiment of the present general inventive concept.

Referring to FIG. 18, in a substrate 207 included in a semiconductor package 407 according to this embodiment, a third region C may not exist. That is, a semiconductor chip 150 may be located over a first region A that may extend from within a circumference of a pattern of first connection terminals 105*a* to outside the circumference of the pattern of first connection terminals 105*a*. The semiconductor package 407 may be formed using a gray photo mask as described above with respect to FIG. 4A. Alternatively, the semiconductor package 407 may be formed using a blast process as described above with respect to FIGS. 8A and 9A, for example. When the semiconductor package 407 is formed using the blast process, after performing a first blast process with respect to an entire surface of the substrate 207 without forming a first mask pattern 195 shown in FIGS. 8A and 8B, a second mask pattern (See a reference number 197 of FIGS. 9A and 9B) is formed to cover a first region A of FIG. 18, and then, a second blast process is performed. When the semiconductor package 407 includes no third region C having a smooth or even surface, it is possible to omit a step of the photolithography process described above with respect to FIG. 8A. Methods of forming the semiconductor package 407 and the features of the semiconductor package 407 may be similar to those described in FIGS. 1-9B.

Figure 19:
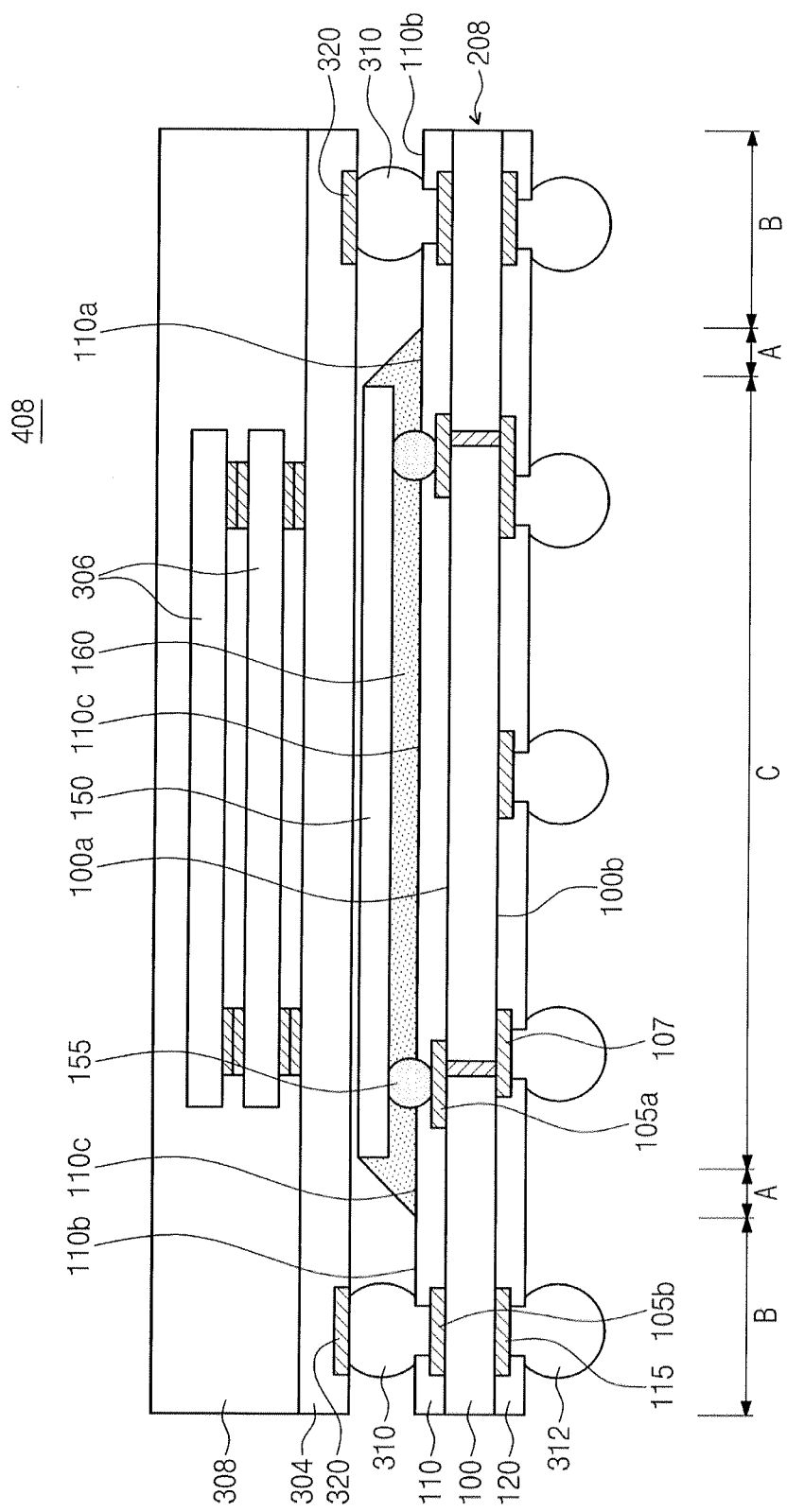
FIG. 19 is a cross-sectional view of a semiconductor package according to another embodiment of the present general inventive concept.

FIG. 19 is a cross-sectional view of a semiconductor package according to another embodiment of the present general inventive concept.

Referring to FIG. 19, a semiconductor package 408 according to this embodiment includes a first substrate 208. The first substrate 208 may correspond to the substrate 200 of FIG. 2B. That is, the first substrate 208 includes first to third regions A, B, C. The first substrate 208 includes a substrate body 100 including a first surface 100a and a second surface 100b, a first insulating layer 110 and a second insulating layer 120. The first insulating layer 110 has a first surface portion 110a at the first region A, and a second surface portion 110b connected with the first surface portion 110a at the second region B. Also, the first insulating layer 110 has a third surface portion 110c at the third region C. A first connection terminal 105a is disposed at the first region A and a second connection terminal 105b is disposed at the second region B. Third connection terminals 115 are disposed on the second surface 100b. External solder balls 312 may be attached to the third connection terminals 115. The first semiconductor chip 150 may be bonded to the first connection terminal 105a in a flip chip bonding. A space between the first semiconductor chip 150 and the first substrate 208 is filled with a passivation layer 160. A second substrate 304 may be disposed above the first substrate 208 so as be spaced apart from the semiconductor chip 150. A second substrate external connection terminal 320 is disposed below the second substrate 304 and an inner solder ball 310 is disposed between the second substrate external connection terminal 320 and the second connection terminal 105b to electrically connect the first substrate 208 with the second substrate 304. A plurality of second semiconductor chips 306 may be mounted by a method of a flip chip bonding or a wire bonding on the second substrate 304. The second semiconductor chips 306 and a top surface of the second substrate 304 are covered with a molding layer 308.

The first to third surface portions 110a, 110b, 110c may have the structures disclosed in FIGS. 1-16B or a combination structure thereof. By doing so, the passivation layer 160 may be formed only below the semiconductor chip 150.

Figure 20:
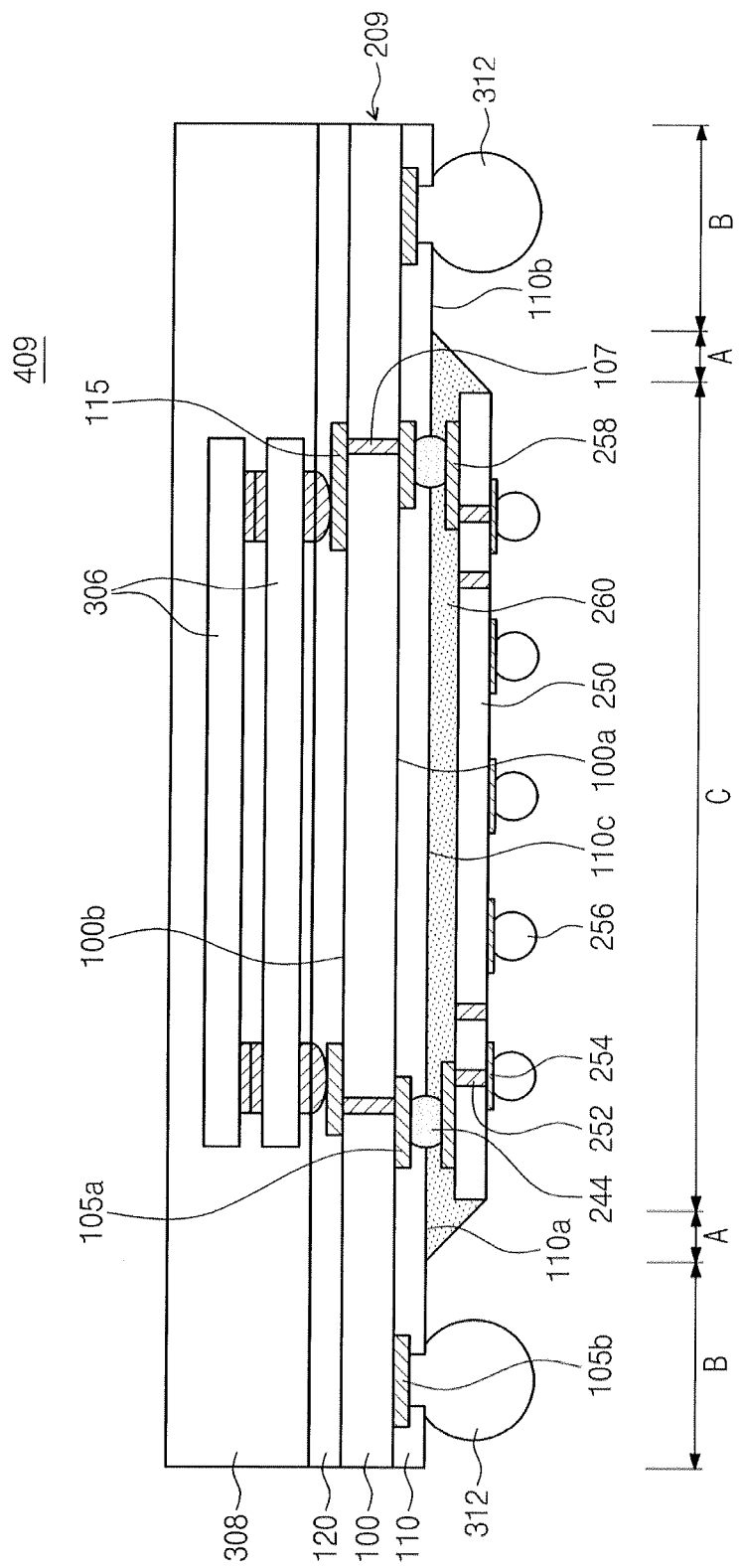
FIG. 20 is a cross-sectional view of a semiconductor package according to another embodiment of the present general inventive concept.

FIG. 20 is a cross-sectional view of a semiconductor package according to another embodiment of the present general inventive concept.

Referring to FIG. 20, a semiconductor package 409 according to this embodiment includes a substrate 209. The substrate 209 may correspond to the substrate 200 of FIG. 2B. That is, the substrate 209 includes first to third regions A, B, and C. The substrate 209 includes a substrate body 100 including a first surface 100a and a second surface 100b, a first insulating layer 110, and a second insulating layer 120. The first insulating layer 110 has a first surface portion 110a at the first region A, and a second surface portion 110b at the second region B. Also, the first insulating layer 110 has a third surface portion 110c at the third region C. A first connection terminal 105a is disposed at the first region A and a second connection terminal 105b is disposed at the second region B. Third connection terminals 115 are disposed on the second surface 100b. The first surface 100a is oriented downwardly and the second surface 100b is oriented upwardly. That is, the substrate 209 of this embodiment is similar to a configuration in which the substrate of FIG. 2 is overturned.

A first semiconductor chip 250 is mounted on the first connection terminal 105. The first semiconductor chip 250 may include a through via 252 penetrating therethrough. Rewiring pads 258 electrically connected with the through via 252 are disposed on a surface of the semiconductor chip 250 facing the first surface 100a. The rewiring pads 258 are electrically connected with the first connection terminal 105a by a bump 244. A space between the first semiconductor chip 250 and the substrate 209 is filled with a passivation layer 260. A first solder ball 312 is attached to the second connection terminal 105b. Chip ball lands 254 electrically connected with the through via 252 are disposed on a bottom surface of the semiconductor chip 250. A second solder ball 256 is attached to the chip ball lands 254. The size of the first solder ball 312 may be different from that of the second solder ball 256 as shown in FIG. 20. A plurality of second semiconductor chips 306 may be stacked and mounted by a method of a flip chip bonding or wire bonding on the substrate 209. The second semiconductor chips 306 and a top surface of the substrate 209 may be covered with a molding layer 308.

In this structure, the first to third surface portions 110a, 110b, 110c may have the structures disclosed in FIGS. 1-16B or a combination structure thereof. By doing so, the passivation layer 260 may be formed only between the first semiconductor chip 250 and the substrate 209 and not cover the second connection terminal 105b.

Figure 21:
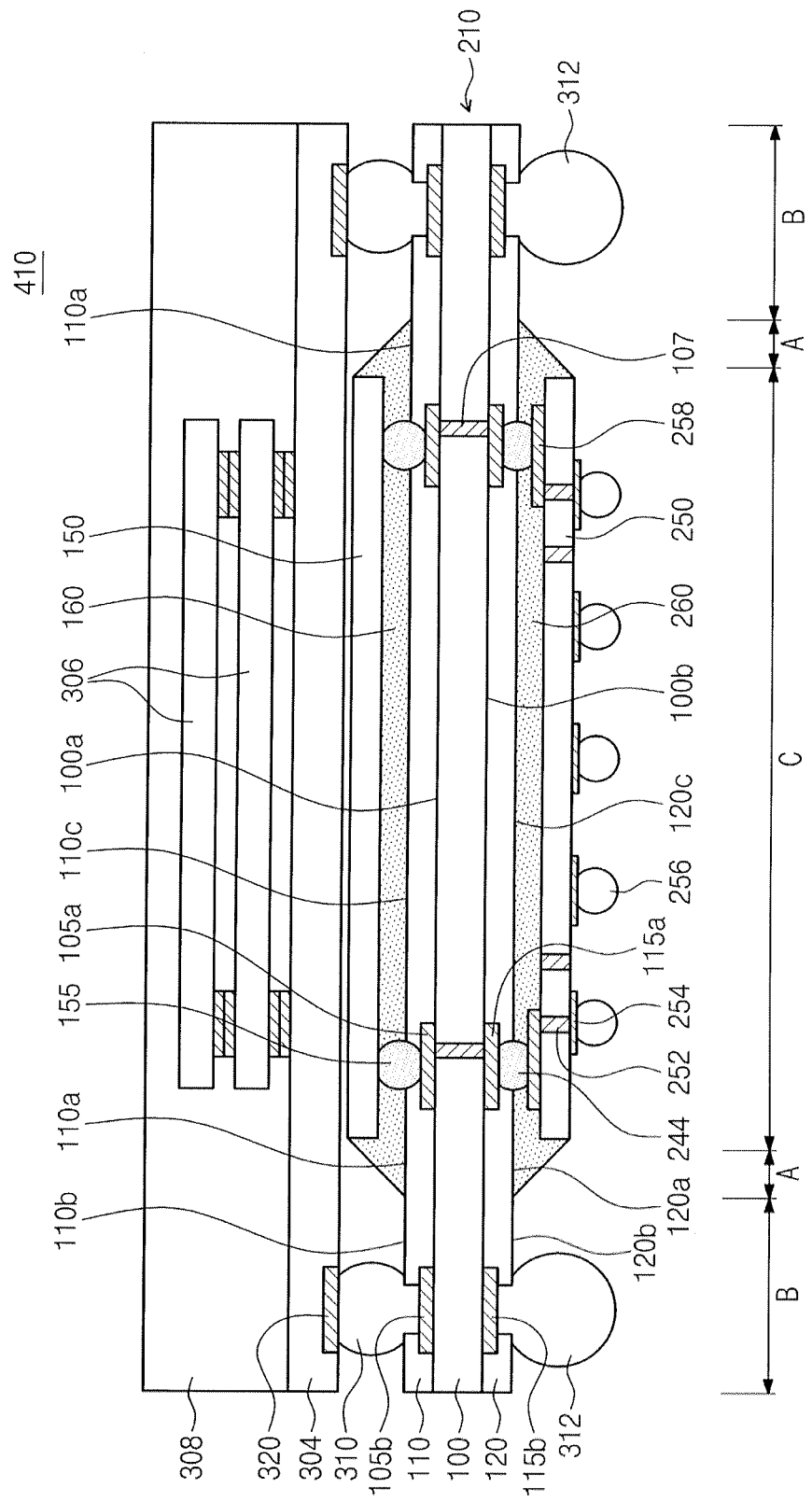
FIG. 21 is a cross-sectional view of a semiconductor package according to another embodiment of the present general inventive concept.

FIG. 21 is a cross-sectional view of a semiconductor package according to another embodiment of the present general inventive concept.

A semiconductor package 410 according to Embodiment 11 may have a configuration in which the structure of the semiconductor package 408 of Embodiment 9 and the structure of the semiconductor package 409 of Embodiment 10 are combined.

That is, referring to FIG. 21, the semiconductor package 410 includes a first substrate 210. The first substrate 210 may correspond to the substrate 200 of FIG. 2B. That is, the first substrate 210 includes first to third regions A, B, and C. The first substrate 210 includes a substrate body 100 including a first surface 100a and a second surface 100b, a first insulating layer 110 and a second insulating layer 120. The first insulating layer 110 has a first surface portion 110a at the first region A, and a second surface portion 110b connected with the first surface portion 110a at the second region B. Also, the first insulating layer 110 has a third surface portion 110c at the third region C. A first connection terminal 105a is disposed on the first surface 100a at the first region A and a second connection terminal 105b is disposed on the first surface 100a at the second region B. The second insulating layer 120 has a fourth surface portion 120a at the first region A, and a fifth surface portion 120b connected with the fourth surface portion 120a at the second region B. Also, the second insulating layer 120 has a sixth surface portion 120c at the third region C. A third connection terminal 115a is disposed on the second surface 100b at the first region A and a fourth connection terminal 115b is disposed on the second surface 100b at the second region B.

The fourth surface portion 120a may have a surface roughness which is the same as the first surface portion 110a. The fifth surface portion 120b may have a surface roughness which is the same as the second surface portion 110b. The sixth surface portion 120c may have a surface roughness which is the same as the third surface portion 110c. A first semiconductor chip 150 may be mounted on the first connection terminal 105a in a flip chip bonding. A space between the first semiconductor chip 150 and the first substrate 210 is filled with a first passivation layer 160. A second semiconductor chip 250 may be mounted on the third connection terminal 115a. A space between the second semiconductor chip 250 and the first substrate 210 is filled with a second passivation layer 260. The second semiconductor chip 150 may include a through via 252 penetrating therethrough.

Rewiring pads 258 electrically connected with the through via 252 are disposed on a surface of the second semiconductor chip 250 facing the second surface 100b. The rewiring pads 258 are electrically connected with the third connection terminal 115a by a bump 244. Chip ball lands 254 electrically connected with the through via 252 are disposed on a bottom surface of the second semiconductor chip 250. A first solder ball 312 is attached to the fourth connection terminal 115b and a second solder ball 256 is attached to the chip ball lands 254. The size of the first solder ball 312 may be different from that of the second solder ball 256 as shown in FIG. 21. A second substrate 304 electrically connected with the second connection terminal 105b is disposed above the first substrate 210. A plurality of third semiconductor chips 306 may be stacked and mounted on the second substrate 304. The third semiconductor chips 306 and a top surface of the second substrate 304 may be covered with a molding layer 308.

The foregoing semiconductor packaging techniques may be applied to a variety of semiconductor devices and package module provided with such semiconductor devices.

Figure 22:
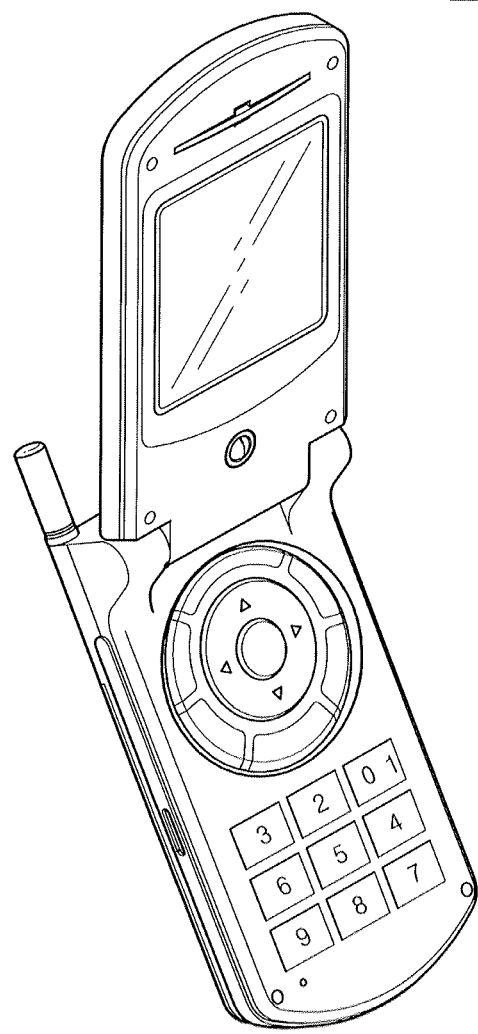
FIG. 22 is a perspective view illustrating an electronic device having a semiconductor package according to embodiments of the present general inventive concept.

FIG. 22 is a perspective view illustrating an electronic device having a semiconductor package according to embodiments of the present general inventive concept. Referring to FIG. 22, a semiconductor package according to embodiments of the present general inventive concept may be applied to an electronic device 1000 like a cellular phone. Since the semiconductor package of the present general inventive concept is superior at size reduction and performance improvement, it is easier to fabricate the electronic device 1000 having variable functions to be light, thin, short and small. The electronic device is not limited to the cellular phone illustrated in FIG. 22 but may include variable electronic devices such as a mobile electronic device, laptop computer, portable computer, portable multimedia player (PMP), MP3 player, camcorder, web tablet, wireless phone, navigation, and personal digital assistant (PDA).

Figure 23:
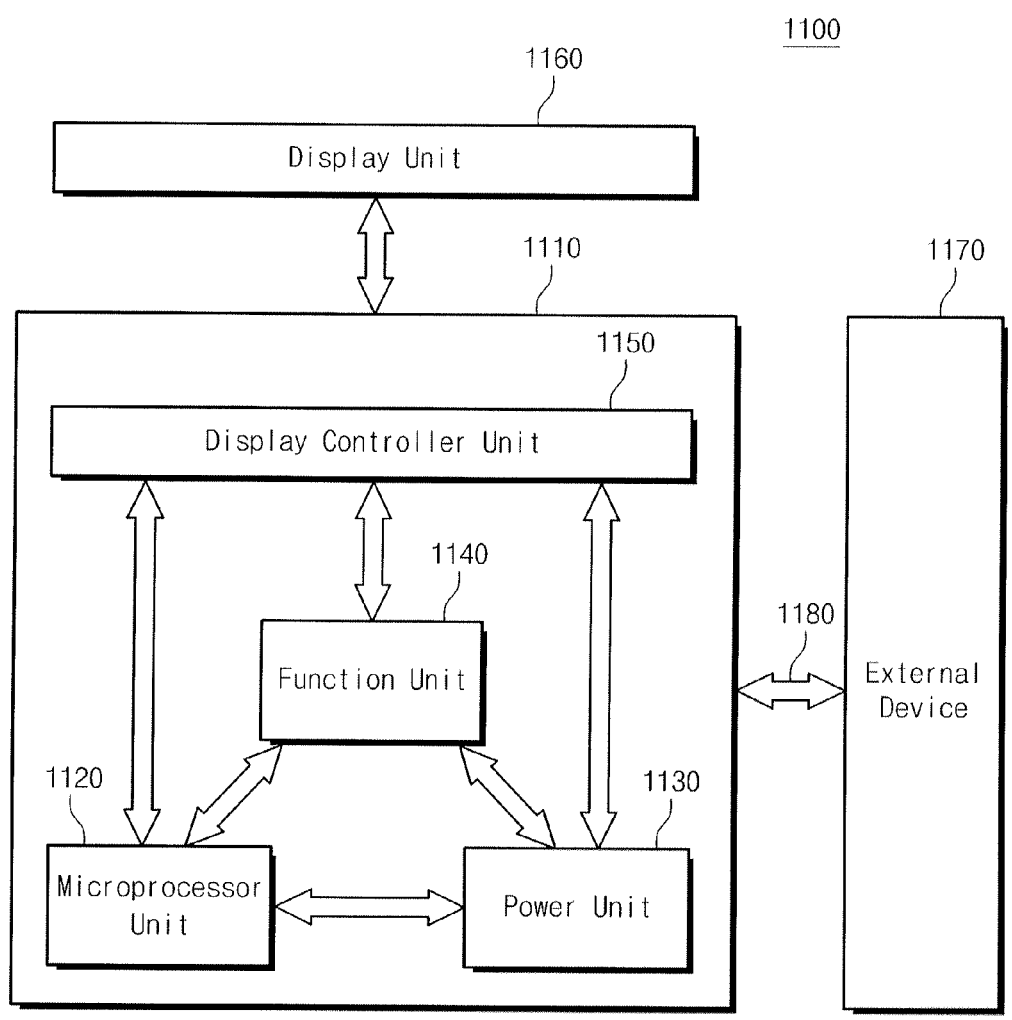
FIG. 23 is a system block diagram showing an example of an electronic device including a semiconductor package to which the present general inventive concept is applied.

FIG. 23 is a system block diagram showing an example of an electronic device or system including a semiconductor package to which the present general inventive concept is applied. Referring to FIG. 23, semiconductor packages 400-410 explained above may be applied to an electronic device or system 1100. The electronic system 1100 may include a body 1110, a display controller unit 1150, a function unit 1140, a microprocessor unit 1120, and a power unit 1130. The body 1110 may include a set board formed as a printed circuit substrate inside the body 1110. The microprocessor unit 1120, the power unit 1130, the function unit 1140, and the display controller unit 1150 may be mounted on the body 1110.

The power unit 1130 receives a constant voltage from an external battery (not shown), divides the voltage to a required voltage level and supplies the required voltage to the microprocessor unit 1120, the function unit 1140, and the display controller unit 1150.

The microprocessor unit 1120 receives a voltage from the power unit 1130 and can control the function unit 1140 and the display unit 1160. The function unit 1140 may perform variable functions of the electronic device 1000. For example, if the electronic device 1000 is a cellular phone, the function unit 1140 may include several components capable of performing functions of a cellular phone, such as dialing, outputting image to the display unit 1160 by a communication with an external device 1170, and outputting a voice through a speaker. Furthermore, if the electronic device 1000 is a cellular phone with a camera, the function unit 1140 may include a camera image processor. For example, if the electronic device is connected to a memory card for expanding a capacity, the function unit 1140 may include a memory card controller. The function unit 1140 may transmit and receive signals to and from the external device 1170 through wired or wireless communication unit 1180. For example, if the electronic device requires a universal serial bus (USB) for expanding functions, the function unit 1140 may be an interface controller. The semiconductor packages 400-410 according to embodiments of the present general inventive concept may be used as any one out of the microprocessor unit 1120 and the function unit 1140.

Figure 24:
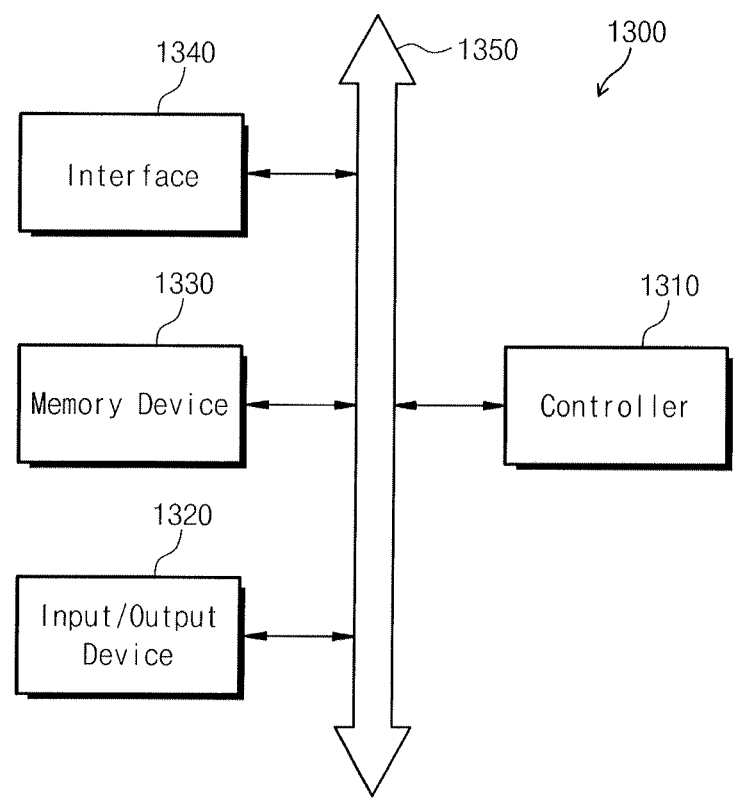
FIG. 24 is a block diagram showing an example of an electronic device including a semiconductor package to which the present general inventive concept is applied.

The foregoing semiconductor package techniques may be applied to an electronic system. FIG. 24 is a block diagram showing an example of an electronic device or system including a semiconductor package to which the present general inventive concept is applied. Referring to FIG. 24, an electronic device or system 1300 may include a control unit or controller 1310, an input/output unit or device 1320, and/or a memory unit or device 1330. The control unit 1310, the input/output unit 1320, and the memory unit 1330 may be connected to each other through a bus 1350. The bus 1350 may be a path through which data is transmitted. For example, the control unit 1310 may include at least one microprocessor, a digital signal processor, a micro controller, and at least one logic device. The control unit 1310 and the memory unit 1330 may include a semiconductor package according to the present general inventive concept. The input/output unit 1320 may include a keypad, keyboard, and/or a display device, for example. The memory unit 1330 may be configured to store data. The memory unit 1330 may store data and/or commands executed by the control unit 1310. The memory unit 1330 may include a volatile memory device and/or a nonvolatile memory device. For example, the memory unit 1330 may be formed by a flash memory. The flash memory may be installed in an information processing system such as a mobile device or a desktop computer. The flash memory may constitute a solid state device (SSD). In this case, the electronic system 1300 can stably store high-capacity data in the flash memory system 1310. The electronic system 1300 may further include an interface 1340 to transmit and receive data to and from a communication network, for example. The interface 1340 may have a wired and/or a wireless connection. For example, the interface 1340 may include an antenna and/or a wired/wireless transceiver. Although not illustrated in the drawings, it will be apparent to those skilled in the art that the electronic system 1300 may further include an application chipset, a camera image processor (CIS), and an input/output unit.

According to the semiconductor packages of the embodiments of the present general inventive concepts, since a surface of the substrate has different surface roughnesses for respective regions, an underfill resin solution does not invade an unwanted region while a passivation layer is formed. Therefore, a dam structure or the like for preventing a flow of the underfill resin solution is not needed. Consequently, a horizontal/vertical size of the semiconductor package can be decreased, a region for re-wiring can be secured, and the passivation layer capable of protecting the semiconductor package from external moisture or contamination can be formed efficiently.

The above-disclosed subject matter is to be considered illustrative and not restrictive, and the appended claims are intended to cover all such modifications, enhancements, and other embodiments, which fall within the true spirit and scope of the present general inventive concept. Thus, to the maximum extent allowed by law, the scope of the present general inventive concept is to be determined by the broadest permissible interpretation of the following claims and their equivalents, and shall not be restricted or limited by the foregoing detailed description.

What is claimed is:

1. A semiconductor package comprising:
   a substrate having an insulation layer formed with a first surface roughness in a first region and a second surface roughness in a second region;
   a semiconductor chip; and
   a protection layer between the first region and the semiconductor chip,
   wherein top surfaces of the first region and the second region are coplanar.

2. The semiconductor package of claim 1, wherein the surface roughness of the first region has a depth and a width different than a depth and a width of the second region.

3. The semiconductor package of claim 1, wherein the second region comprises a plurality of grooves.

4. The semiconductor package of claim 1, wherein the second region surrounds the first region.

5. The semiconductor package of claim 1, wherein the surface roughness of the first region has a flowability of the protection layer different from a flowability of the protection layer in the second region.

6. The semiconductor package of claim 5, wherein the flowability of the protection layer in the first region is greater than the flowability of the protection layer in the second region.

7. The semiconductor package of claim 1, wherein the first region has a wettability of the protection layer different from a wettability of the protection layer in the second region.

8. The semiconductor package of claim 1, wherein the protection layer has at least one boundary located at an edge of the first region and the second region.

9. The semiconductor package of claim 1, wherein the protection layer has at least two external sides having at least one of a U-shape and a curved shape.

10. The semiconductor package of claim 1, wherein the substrate has a chip mounting area on which the semiconductor chip is mounted that is smaller than the first region of the substrate.

11. The semiconductor package of claim 1, wherein:
    the second region of the substrate comprises a first portion disposed close to the semiconductor chip and a second portion disposed away from the semiconductor chip; and
    the protection layer is not located on the second portion of the second region of the substrate.

12. The semiconductor package of claim 11, wherein
    the first portion of the second region of the substrate has a first width in a first direction parallel to an upper surface of the substrate and the second portion of the second region has a second width in the first direction, and the first width is narrower than the second width.

13. The semiconductor package of claim 11, wherein the substrate comprises a contact pad area in which one or more contact pads are disposed, and the second portion of the second region includes the contact pad area.

14. The semiconductor package of claim 1, wherein the first region comprises a first portion with a first surface roughness and a second portion with a second surface roughness, and the first surface roughness and the second surface roughness of the first region are different from the surface roughness of the second region.

15. The semiconductor package of claim 14, wherein the second region comprises a first portion spaced apart from a chip mounting area by a first distance and a second portion spaced apart from a chip mounting area by a second distance.

16. The semiconductor package of claim 14, wherein the substrate comprises a contact pad area in which one or more contact pad are disposed, and the second portion is spaced apart from the contact pad area by a third distance.

17. The semiconductor package of claim 1, wherein the first region comprises a plurality of grooves.

18. A semiconductor package, comprising:
    a substrate having connection terminals to connect to a semiconductor chip; and
    an insulation layer formed on the substrate to have a first region including a first plurality of grooves and a second region including a second plurality of grooves different from the first plurality of grooves and coplanar with the first region,
    wherein the first region includes a chip mounting area corresponding to the connection terminals, and
    the second region has a surface roughness that is different from a surface roughness of the first region.

19. The semiconductor package according to claim 18, wherein the second region entirely surrounds the first region.

20. The semiconductor package according to claim 18, wherein the second region surrounds only three sides of the first region.

21. The semiconductor package according to claim 18, wherein the first region has a substantially flat surface.

22. The semiconductor package according to claim 18, wherein the second region has a surface roughness greater than that of the first region.

23. The semiconductor package according to claim 22, wherein the second region has a center line average surface roughness between 0.01-0.5 µm.

24. The semiconductor package according to claim 18, further comprising a third region surrounding the second region and having a surface roughness different from the surface roughness of the first region and the second region.

25. The semiconductor package according to claim 24, wherein the surface roughness of the third region is greater than the surface roughness of the first and second regions.

26. The semiconductor package according to claim 25, wherein the surface roughness of the second region is greater than the surface roughness of the first region.

27. The semiconductor package according to claim 26, wherein each of the second and third regions has a surface shape substantially corresponding to a square-wave shape, each of the second and third regions having a plurality of troughs and peaks of different heights, depths, and widths to define the surface roughness of the second and third regions, respectively.

28. The semiconductor package according to claim 24, further comprising:
    the semiconductor chip mounted to the connection terminals of the substrate; and
    underfill resin located between the semiconductor chip and the first region of the insulating layer,
    wherein the surface roughness of the second region prevents the underfill resin from flowing past the second region.

29. The semiconductor package according to claim 24, wherein the second region includes a first sub-region and a second sub-region separated by a surface that has substantially the same surface roughness as the surface roughness of the first region.

* * * * *